US012119835B2

(12) United States Patent
Elkholy et al.

(10) Patent No.: US 12,119,835 B2
(45) Date of Patent: Oct. 15, 2024

(54) DIGITAL PRE-DISTORTION METHOD AND APPARATUS FOR A DIGITAL TO ANALOG CONVERTER

(71) Applicant: Avago Technologies International Sales Pte. Limited, Singapore (SG)

(72) Inventors: Ahmed Elkholy, Irvine, CA (US); Jun Cao, Irvine, CA (US); Adesh Garg, Aliso Viejo, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 138 days.

(21) Appl. No.: 17/964,031

(22) Filed: Oct. 11, 2022

(65) Prior Publication Data

US 2024/0120931 A1   Apr. 11, 2024

(51) Int. Cl.
*H03M 1/06* (2006.01)
*H03M 1/66* (2006.01)

(52) U.S. Cl.
CPC ......... *H03M 1/0626* (2013.01); *H03M 1/066* (2013.01); *H03M 1/0665* (2013.01); *H03M 1/0673* (2013.01); *H03M 1/66* (2013.01)

(58) Field of Classification Search
CPC .... H03M 1/0626; H03M 1/0665; H03M 1/66; H03M 1/0673; H03M 1/066
USPC .................................................. 341/118, 144
See application file for complete search history.

(56) References Cited

U.S. PATENT DOCUMENTS

| | | | |
|---|---|---|---|
| 6,535,155 B2 * | 3/2003 | Ruha .................. | H03M 1/067 341/120 |
| 7,868,806 B2 * | 1/2011 | Seo ..................... | H03M 1/004 341/118 |

* cited by examiner

*Primary Examiner* — Khai M Nguyen
(74) *Attorney, Agent, or Firm* — Foley & Lardner LLP

(57) ABSTRACT

A system includes a first circuit configured to provide a digitally pre-distorted input signal, a digital-to-analog converter including a number of unit elements, a digital input, and a digital output. Each unit element is configured to receive a reference voltage and to be controllable by a control signal provided in response to the digitally pre-distorted input signal. The digital-to-analog converter provides an analog output. The first circuit is configured to reduce distortion due to signal dependent changes to the reference voltage. The signal dependent changes can be due at least in part to current through the supply network that supplies the reference voltage. The digital to analog converter can be a voltage mode converter.

21 Claims, 8 Drawing Sheets

FIG. 3

DIGITAL PRE-DISTORTION METHOD AND APPARATUS FOR A DIGITAL TO ANALOG CONVERTER

CROSS-REFERENCE TO RELATED APPLICATIONS

The present application is related to U.S. Ser. No. 17/589,606, filed Jan. 31, 2021, invented by Elkholy et al. entitled, "Transition Aware Dynamic Element Matching," assigned to the assignee of the present application and incorporated herein by reference.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD OF THE DISCLOSURE

The present disclosure relates, in general, to methods, systems, and apparatuses for distortion reduction in digital-to-analog converters.

BACKGROUND OF THE DISCLOSURE

Many modern high-speed communication systems, including wireless and wireline communication systems, often include a digital-to-analog converter (DAC). Certain high-speed communication systems are DAC-based systems. High-resolution, high-speed DACs can suffer from mismatch in timing or amplitude, which can adversely affect overall performance of these systems. Certain approaches to mitigating these errors can result in increased power consumption and hardware complexity while not addressing harmonic effects of the data waveform.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIG. 3 is a schematic diagram illustrating operations of transition aware dynamic element matching, in accordance with various embodiments;

DETAILED DESCRIPTION OF EMBODIMENTS

Figure 1:
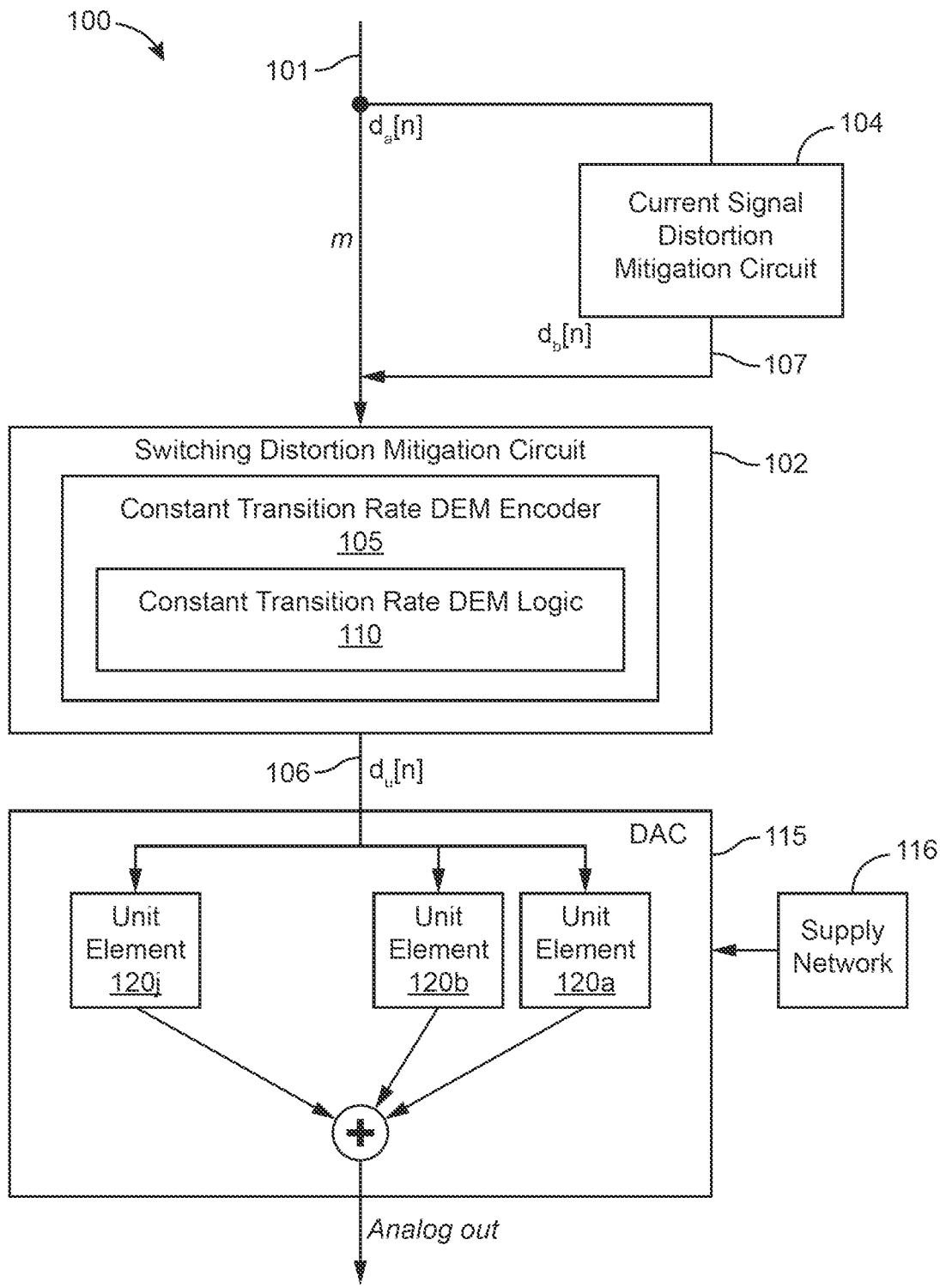
FIG. 1 is a schematic block diagram of a digital-to-analog converter system, in accordance with various embodiments.

Various embodiments provide tools and techniques for distortion reduction. In some embodiments, digital pre-distortion is used to reduce distortion in a circuit such as a digital to analog converter (DAC). In some embodiments, the systems and methods of distortion reduction are used in DACs of high speed communication systems (e.g., 5G base stations, serializer/deserializer (SERDES) systems and optical systems) and other communication and computing systems. In some embodiments, the systems and methods are employed in a data converter based high speed communication system to meet the demanding needs of the modulated systems and to enable more complex equalization techniques in digital domain.

In some embodiments, systems and methods are employed in a high resolution, high speed voltage-mode DAC (VM-DAC) of a transmitter to reduce distortion due to data-dependent modulation of its reference voltage or supply voltage (e.g., provided at a value $V_{REF}$ by a supply network). The systems and methods mitigate distortion due to data-dependent modulation of its reference voltage in some embodiments. The distortion due to data-dependent modulation can result in non-linearity and can be due to switching current (e.g., $I_{SW}(ntrn[n])$ discussed below) and/or signal current (e.g., $I_{sig}$ (code[n]) discussed below) in some embodiments. The switching current $I_{SW}(ntrn[n])$ and signal current (e.g., $I_{sig}$ (code[n]) are used in or provided by DAC cells to produce an analog output signal for the DAC in some embodiments. Distortion generally refers to a degradation of a signal and can affect or relate to timing, phase, amplitude, clipping, quantization noise, aliasing, harmonic interference, frequency response, etc. As used herein, reference voltage may refer to a signal provided at a voltage value for use by other components of the DAC. The reference voltage is provided to DAC cells in the DAC at the value of $V_{REF}$ in some embodiments.

Any digital signal dependent changes to the value of $V_{REF}$ can result in non-linearity which can advantageously be corrected in some embodiments. Digital signal dependent changes refer to changes caused (at least in part) by changes in the digital input signal that result in changes to the value of $V_{REF}$. As used herein, a digital input signal may refer to a signal that represents data as a discrete value or a sequence of discrete values and is provided at an input of a circuit. In some embodiments, the digital input signal is a binary signal or logic signal and can be provided as a bit, a series of bits provided over time, a set of bits in parallel, or a series of bits in parallel provided over time. The digital input signal can be provided as discrete waveforms representing a bit stream, as a modulated signal representing a bit stream, a pulse code modulated signal, or other digital representation. Digital signal dependent changes can be the result of changes to signal current $I_{sig}$ (code[n]) and (2) switching current $I_{SW}$ (ntrn[n]) due to changes in the digital input signal. The current drawn by the VM-DAC is generally provided through a non-ideal supply network which can be represented by an impedance model $Z_{SUP}(\tau)$ and modulates the effective value of $V_{REF}$ causing current signal distortion. Even with very large decoupling capacitors (e.g., having a capacitance of greater than 1 nanoFarad (nF)) and very small supply resistance (e.g., having a resistance of approximately 0.5n), modulation of the $V_{REF}$ value can severely limit the overall performance of a VM-DAC especially as the signal frequency ($F_{sig}$) and/or signal power $P_{sig}$ increases. The output signal value $V_{OUT}$ of the DAC is represented by the following equation where code[n] is the digital input (normalized) to the DAC: $V_{out} \approx$ code[n]$\times V_{REF}$, where code[n] is the digital input signal to the DAC. In some embodiments, the value $V_{REF}$ of the DAC is represented by the following equation: $V_{REF} = V_{DD} - I_{DAC} \times Z_{SUP}(\tau)$, where $V_{DD}$ is the chip supply voltage, and $I_{DAC}$ is the supply current to the DAC.

The supply current $I_{DAC}$ has at least two components: (1) signal current $I_{sig}$ (code[n]) and (2) switching current $I_{SW}$ (ntrn[n]), each of which can be a source of distortion—current signal distortion and switching distortion. In some embodiments, the signal current $I_{sig}$ (code[n]) and (2) switching current $I_{SW}$(ntrn[n]) are main components of the supply current $I_{DAC}$. The supply current $I_{DAC}$ is the current provided by the power supply or power input through the supply network for use by unit elements (e.g., DAC cells). The supply current $I_{DAC}$ can be provided as a signal associated with the reference voltage at the reference voltage level ($V_{REF}$) in some embodiments. The signal current $I_{sig}$ (code[n]) is the current of the output signal of the DAC and is dependent upon the digital input signal—code[n]. In some embodiments, digital pre-distortion is used to reduce the impact of distortion due to signal current $I_{sig}$ (code[n]). Switching current $I_{SW}$(ntrn[n]) is current used to make transitions (e.g., turning on and off DAC cells) and is dependent on the number of transitions (ntrn[n]). Generally, the larger number of transitions, the greater the switching current $I_{sig}$ (code[n]). As circuitry transitions from on to off states and from off to on states, transistors in the circuitry draw switching current $I_{sig}$ (code[n]) to make the transition. Switching current Isig (code[n]) can be associated with changes to signals provided to gates of transistors in the DAC cells in some embodiments. Distortion due to switching current $I_{SW}$(ntrn[n]) can be addressed according to the systems and methods described below with reference to FIGS. 1B-5. Addressing both sources of distortion or nonlinearity provides significant advantages in VM-DACs (e.g., reducing the reference voltage ($V_{REF}$) dependency to levels low enough to make VM drivers viable for radio frequency (RF) applications in some embodiments.

Some embodiments relate to a method that includes receiving a first digital signal, and changing the first digital signal to provide a second digital signal. The first digital signal is changed to reduce distortion associated with a signal current related to a supply current provided through a supply network for a reference voltage signal. The method also includes providing a selection signal for a number of unit elements. The unit elements receive the reference voltage signal, and provide an analog signal in accordance with the second digital signal. As used herein, a unit element may refer a DAC unit cell (e.g., voltage mode cell) or a repeating circuit that cooperates with other repeating circuits to provide the analog output signal. Each unit cell may not be identical to other unit cells. In some embodiments, each unit element may include similar circuits such as selection transistors, impedance circuits, current sources, etc. for providing the analog output signal. In some embodiments, each unit element includes one or more circuit elements, such as transistors, resistors, etc., configured to provide a voltage for the analog signal. In some embodiments, each unit element is a converter cell including a logic circuit and a switching circuit for selecting the voltage for the analog signal. In some embodiments, each unit element includes one or more circuit elements, such as transistors, resistors, etc., configured to provide a current for the analog signal. In some embodiments, the unit elements receive the reference voltage signal and provide voltage or current for the analog output signal in response to a selection signal provided to unit elements. As used herein, a selection signal may refer to a signal that turns unit elements on or off or otherwise control the unit elements to appropriately provide current or voltage for the analog output signal. The selection signal can be a digitally coded signal. Embodiments of unit elements are further described below.

In some embodiments, the method further includes determining a first number of unit elements of a digital-to-analog converter to be turned on from an off state, based, at least in part, on a number of transitions $N_{trn}$, determining a second number of unit elements of the digital-to-analog converter to be turned off from an on state, based, at least in part, on the number of transitions $N_{trn}$, selecting, via dynamic element matching logic, the first number of unit elements from one or more unit elements in the off state to be turned on, and selecting, via the dynamic element matching logic, the second number of individual unit elements from one or more unit elements in the on state to be turned off.

In some embodiments, the method further includes generating the selection signal as a unary code. The unary code is configured to turn on the selected first number of individual unit elements and turn off the selected second number of individual unit elements. Each respective bit position of the unary code controls a state of a respective unit element corresponding to the respective bit position. The method also includes controlling the state of each of the plurality of unit elements based on the unary code. A selection signal as used herein may refer to a signal that controls unit elements (e.g., turns unit elements on or off).

In some embodiments, wherein determining whether the number of transitions $N_{trn}$ can be performed further include determining whether the current value of the second digital signal is less than ($N_{trn}/2$), and further that the total number of unit elements minus the current value of the second digital signal is greater than ($N_{trn}/2$).

In some embodiments, the method further includes adjusting the number of transitions $N_{trn}$ based on a determination that the number of transitions $N_{trn}$ cannot be performed, wherein adjusting the number of transitions $N_{trn}$ includes reducing the value of the number of transitions $N_{trn}$.

In some embodiments, the method further includes wherein changing the first digital signal uses a digital filter having a response related to a response of the supply network. In some embodiments, a digital filter is circuitry or processing that performs mathematical operations on a sampled, discrete-time signal to reduce or enhance certain aspects of that signal. The digital filter can have a response set by digital filter coefficients.

In some embodiments, changing the first digital signal is a digital pre-distortion operation.

In some embodiments, the digital pre-distortion operation comprises an open loop approach using pre-defined digital filter coefficients and a d2 gain coefficient or comprises a closed loop approach using an analog-to-digital converter (ADC) to digitize the analog output and a distortion detection and minimization digital processor to adaptively set digital filter coefficients and a d2 gain coefficient. An open loop approach refers to an operation where the output has no direct influence on the input signal (e.g., without a feedback loop). A closed loop approach refers to an operation where the output or derivation thereof is feedback to affect the provision of the output signal (e.g., with a feedback path).

Some embodiments relate to a circuit including a number of unit elements, a digital input configured to receive a first digital signal, circuitry configured to adjust the first digital signal in accordance with a supply network response and provide a second digital signal, and circuitry configured to provide a code for selectively turning the unit elements to an on state or an off state in accordance with the second digital signal. The code is provided such that a variation in a number of the unit elements transitioning from the off state to the on state or from the on state to the off state is decreased. As used herein, variation may refer to a characteristic where higher variation reflects more changes and lower variation reflects fewer changes. For example, making fewer transitions from the on state to the off state and vice versa results in higher consistency or less variation.

In some embodiments, the second circuit reduces distortion due to switching current associated with the unit elements. In some embodiments, the first circuit provides digital pre-distortion to reduce distortion due to current through a supply network.

In some embodiments, the second circuit reduces distortion due to switching current in the circuit.

In some embodiments, the first circuit comprises a digital filter having a response matching the supply network response.

In some embodiments, the second digital signal is related to the following expression: $(x_a + d_2 x_a \times x_a^2 * h_{SUP}(nT))$ where $x_a$ is the first digital signal, $d_2$ is a coefficient, and $h_{SUP}(nT)$ is related to the supply network response.

In some embodiments, the $d_2$ coefficient is related to a quotient comprising the term $h_{SUP}(nT)$.

Some embodiments relate to a system including a first circuit configured to provide a digitally pre-distorted input signal, a digital-to-analog converter including a number of unit elements, a digital input, and a digital output. Each unit element is configured to receive a reference voltage and to be controllable by a control signal provided in response to the digitally pre-distorted input signal. The digital-to-analog converter provides an analog output. The first circuit is configured to reduce distortion due to signal dependent changes to the reference voltage.

In some embodiments, the signal dependent changes are due at least in part to current through the supply network that supplies the reference voltage.

In some embodiments, the first circuit includes a first multiplier configured to receive an input signal, a subtracter coupled to the first multiplier, a filter coupled to the subtracter, a second multiplier coupled to the filter, an adder coupled to the first multiplier and the second multiplier, and a third multiplier coupled between the first multiplier and the second multiplier.

In some embodiments, the filter has a response corresponding to a response of a supply network for the reference voltage.

In some embodiments, the system further includes a second circuit configured to provide a code for selectively turning the unit elements to an on state or an off state in accordance with the digitally pre-distorted input signal. The code is provided such that a consistency of a number of the unit elements transitioning from the off state to the on state or from the on state to the off state is increased.

In some embodiments, a method for transition aware dynamic element matching is provided. The method may include determining a number of unit elements of a digital-to-analog converter to be transitioned ($N_{trn}$), from an on state to an off state, or an off state to an on state. The method may continue by determining a first number of unit elements of a digital-to-analog converter to be turned on from an off state, based, at least in part, on $N_{trn}$, and determining a second number of unit elements of the digital-to-analog converter to be turned off from an on state, based, at least in part, on $N_{trn}$. The method may further include selecting, via dynamic element matching logic, the first number of individual unit elements from one or more unit elements of the digital-to-analog converter in the off state to be turned on, and selecting, via the dynamic element matching logic, the second number of individual unit elements from one or more unit elements of the digital-to-analog converter in the on state to be turned off.

In some embodiments, an apparatus for transition aware dynamic element matching is provided. The apparatus may include a register configured to store a constant transition rate value, wherein the constant transition rate value is given by a number of unit elements of a digital-to-analog converter to be transitioned ($N_{trn}$), from an on state to an off state, or an off state to an on state. The apparatus may further include a dynamic element matching circuit coupled to the register. The dynamic element matching circuit may be configured to determine a first number of unit elements of a digital-to-analog converter to be turned on from an off state, based, at least in part, on $N_{trn}$, and determine a second number of unit elements of the digital-to-analog converter to be turned off from an on state, based, at least in part, on $N_{trn}$. The dynamic element matching circuit may further be configured to generate a first signal, wherein the first signal indicates a selection of the first number of individual unit elements, wherein the first signal further identifies the individual unit elements of one or more unit elements of the digital-to-analog converter in the off state to be turned on, and generate a second signal, wherein the second signal indicates a selection of the second number of individual unit elements, wherein the second signal further identifies the individual unit elements of one or more unit elements of the digital-to-analog converter in the on state to be turned off.

In further embodiments, a system for transition aware dynamic element matching is provided. The system may include a digital-to-analog converter comprising a plurality of unit elements, each unit element configured to be controllable by a control signal. The system may further include a dynamic element matching encoder coupled to the digital-to-analog converter, the dynamic element matching encoder configured to generate the control signal based on a digital input, wherein the dynamic element matching encoder includes a circuit. The circuit may be configured to determine a number of unit elements of a digital-to-analog converter to be transitioned ($N_{trn}$), from an on state to an off state, or an off state to an on state. The circuit may further be configured to determine a first number of unit elements of a digital-to-analog converter to be turned on from an off state of an $N_{trn}$ number of transitions, and determine a second number of unit elements of the digital-to-analog converter to be turned off from an on state of the $N_{trn}$ number of transitions. The circuit may further generate a first signal, wherein the first signal indicates a selection of the first number of individual unit elements, wherein the first signal further identifies the individual unit elements of one or more unit elements of the digital-to-analog converter in the off state to be turned on, and generate a second signal, wherein the second signal indicates a selection of the second number of individual unit elements, wherein the second signal further identifies the individual unit elements of one or more unit elements of the digital-to-analog converter in the on state to be turned off.

In the following description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes discussed herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Conventional approaches to mitigating timing and amplitude errors in DACs often result in increased power requirements, increased hardware complexity, and an inability to address second harmonic distortion. Conventional techniques focus on indiscriminate randomization of errors by dynamically switching between DAC unit elements, as in conventional dynamic element matching (DEM), utilizing inefficient switching schemes. Specifically, DEM refers to techniques for randomizing errors attributable to individual unit elements by dynamically switching the individual DAC unit elements that are used for a given DAC code. This breaks the static relationship between the DAC code (e.g., an input code) and the errors by random rotation of the thermometer bits (e.g., a unary code for controlling the unit elements of the DAC). Other approaches utilize additional components, such as a dummy switch or a random signal chopper, each of which introduces additional complexity, inefficiency, switching noise, and increases in power consumption.

Thus, some embodiments set forth below may allow for a more efficient, targeted distortion mitigation scheme for a DAC for data-dependent modulation of its reference voltage or supply voltage (at a value VREF). In some embodiments, systems and methods provide distortion mitigation for transition aware dynamic element matching scheme for switching DAC unit elements. Some embodiments below describe the use of a constant transition rate DEM scheme to determine how many DAC unit elements and which individual DAC unit elements to switch. Advantages of some embodiments set forth below may include a constant current draw from the pre-driver power supply, which reduces power supply ripple and resulting intersymbol interference (ISI), and may further mitigate harmonic distortion ($HD_n$) spurs. Moreover, by utilizing the constant transition rate-DEM (CTR-DEM) approach, a "just enough" transient switching may be realized, without excessive increases to switching noise for lower power output signals as would result from conventional DEM schemes. These features may further help realize a lower noise floor that scales with signal power. Moreover, a CTR-DEM algorithm may mitigate second harmonic distortion (HD2) by enforcing a constant transition rate, thereby making the error profile consistent.

The CTR-DEM algorithm may also be paired with other digital pre-distortion correction to further improve DAC performance. Moreover, the noise floor scales with input power to maintain a robust signal-to-noise ratio (SNR), which directly increases DAC dynamic range. CTR-DEM algorithm may be implemented entirely in the digital domain so as not to disturb the sensitive and high-speed analog sections of the DAC. Additionally, power supplies with reduced ripple may require less rigorous external filtering and isolation between the supplies, which can reduce system cost and increase the channel density and data throughput of the overall system. Compared to conventional DEM DACs, some embodiments set forth below may allow for scaling of the number of transitions with DAC output power and frequency, which further allows users to fine tune the SNR of the system.

FIG. 1 is a schematic block diagram of a digital to analog converter (DAC) system 100 that provides mitigation for distortion due to switching current $I_{SW}$(ntrn[n]), and/or signal current $I_{sig}$ (code[n]). DAC system 100 includes a current signal distortion mitigation circuit 104 signal for correcting or reducing distortion or non-linearity due to signal current, a switching distortion mitigation circuit 102 for correcting or reducing distortion or non-linearity due to switching current, and a DAC 115. DAC system 100 converts a digital input $d_a$[n] at input 101 to an analog output signal at output 103. Current signal distortion mitigation circuit 104 pre-distorts or adjusts the digital input $d_a[n]$ at input 101 to be a digital input $d_b[n]$ at output 107 for reception by switching distortion mitigation circuit 102. Current signal distortion mitigation circuit 104 and switching distortion mitigation circuit 102 can be implemented serially in any order to provide pre-distortion of the digital input $d_a[n]$ at input 101 and cooperate to provide both current signal distortion mitigation and switching distortion mitigation in some embodiments. In some embodiments, only one of current signal distortion mitigation circuit 104 and switching distortion mitigation circuit 102 is utilized.

FIGS. 1-5 and the accompanying description below describe switching distortion mitigation circuit 102 of DAC system 100 (e.g., a transition aware dynamic element matching digital-to-analog converter system to achieve mitigation for distortion due to switching current) in accordance with various embodiments. FIGS. 1 and 6-8 and the accompanying description below describe current signal distortion mitigation circuit 104 of DAC system 100 (e.g., a signal current aware dynamic digital pre-distortion digital-to-analog converter system to achieve mitigation for distortion due to signal current) in accordance with various embodiments. DAC system 100 can be configured to provide only one of the mitigation for distortion due to switching current or signal current or both. Although embodiments of each type of mitigation technique are discussed below, DAC system 100 can utilize other types of mitigation techniques or be combined with other types of mitigation techniques according to some embodiments. Digital pre-distortion refers to a technique that digitally adjusts an input value with an effect of reducing distortion (e.g., non-linearity and/or intermodulation distortion due to signal current $I_{sig}$ (code[n])). A digital pre-distortion operation refers to an operation that uses digital pre-distortion.

With reference to FIG. 1, switching distortion mitigation circuit 102 includes a constant transition rate dynamic element matching (CTR-DEM) encoder 105 coupled to DAC 115. The CTR-DEM encoder 105 further includes CTR-DEM logic 110, and DAC 115 further includes one or more unit elements 120a-120j. Unit elements 120 are supplied voltage at the level $V_{REF}$ by a supply network 116 in some embodiments. It should be noted that the various components of the system 100 are schematically illustrated in FIG. 1, and that modifications to the various components and other arrangements of system 100 may be possible and in accordance with the various embodiments.

In various embodiments, CTR-DEM encoder 105 may be configured to receive an m-bit digital input $d_a[n]$ from input 101 or an m-bit pre-distorted digital input $d_b[n]$ from output 107 of current signal distortion mitigation circuit 104, where m is an integer. The CTR-DEM encoder 105 may be configured to code the m-bit digital input to produce a j-bit unary code, $d_u[n]$, where j is an integer corresponding to a maximum decimal value of an m-bit number (e.g., $j=2^m-1$). For example, if m=4, j=15, with j corresponding to the 4-bit value of "1111." Similarly, for m=7, j=127.

In various examples, the CTR-DEM encoder 105 may be coupled to the DAC 115. The DAC 115 may include one or more unit elements 120a-120j. In some examples, the DAC 115 may have a j-number of unit elements corresponding to the number of bits of the digital output of the CTR-DEM encoder 105. Thus, in some examples, the digital output $d_u[n]$ at input 106 may comprise j-number of individual bits, $d_{u,i}[n]$. Thus, in some examples, each individual bit $d_{u,i}[n]$ of the CTR-DEM encoder 105 may be a single-bit digital input of a corresponding i-th unit element 120a-120j, where i is an integer 1-j. Unit elements 120a-120j are DAC cells in some embodiments.

Accordingly, in some examples, the digital output (e.g., unary code) $d_u[n]$ may be a coded control signal generated by the CTR-DEM encoder 105, such as a unary-coded (also referred to as "thermometer coded") signal, which is generated from the binary digital signal $d_a[n]$ or $d_b[n]$. The digital output $d_u[n]$ may be a control signal that indicates, or otherwise selects, which unit elements 120a-120j of the DAC 115 are enabled.

In various examples, CTR-DEM logic 110 may be implemented in hardware, software, or a combination of hardware and software. In some examples, the CTR-DEM encoder 105 and CTR-DEM logic 110 may be implemented, without limitation, as a circuit (including logical circuits), custom integrated circuits (ICs), system on a chip (SoC), or field-programmable gate array (FPGA) implementations. In other examples, CTR-DEM encoder 105 may be implemented as part of a DAC controller. For example, CTR-DEM logic 110 may be implemented as part of the firmware of a DAC controller.

According to various embodiments, the DAC 115 may include circuitry and components to convert a digital signal into an analog signal, such as wireless (e.g., radio frequency (RF)) and/or wireline signals (e.g., fiber optic, copper-wire, twisted pair, etc.). DAC 115 can be a VM-DAC or current mode DAC in some embodiments. In some embodiments, the DAC is a VM-DAC as opposed to a capacitive-DAC and current based current mode logic (CML) DAC. A VM-DAC is a DAC that uses unit elements to selectively provide a voltage of the output signal corresponding to the digital input in some embodiments. A VM-DAC uses a resistive ladder or other impedance circuit or uses a logic circuit and a switch circuit to selectively provide a voltage level for the analog output signal in some embodiments. A current mode DAC is a DAC that combines (e.g., sums) current from DAC cells to provide the analog output signal. The DAC 115 may include DACs of various architectures and/or designs, including, without limitation, pulse-width modulation (PWM) DACs, delta-sigma DACs, thermometer-coded DACs, oversampling DACs, noise-shaped DACs, digitally-controlled oscillators, resistor DACs (e.g., resistor ladder (R-2R) DACs), current DACs, voltage DACs, switched-capacitor DACs, unary DACs, binary-weighted DACs, or other suitable DAC designs. In further embodiments, DACs may implement a combination of designs, using a combination of components (e.g., resistors, capacitors, current sources, voltage sources, etc.). In yet further examples, DAC system 100 may be part of an ADC. For example, DAC system 100 may form at least part of a clock-data-recovery (CDR) circuit of an ADC. For example, DAC system 100 may be a phase interpolator DAC, configured to output an analog signal based on a phase interpolator code.

In some further examples, the DAC 115 may utilize a combined and/or hybrid design. For example, in various embodiments, the unit elements of DAC 115 may themselves be individual DACs. In some examples, the DAC 115 may include, without limitation, unary unit elements and/or binary-weighted unit elements. For example, in some embodiments, the DAC 115 may include a plurality of unary unit elements, where the respective outputs of all unit elements have the same weight. In other examples, a segmented or "hybrid" design may be utilized. In the segmented design, DAC 115 may include both unary unit elements (where the respective outputs of all unit elements are weighted the same), and binary-weighted unit elements (e.g., the outputs of unit elements may be respectively weighted).

In some examples, the DAC 115 may include j-number of unit elements 120a-120j. In some examples, updates to an analog signal may occur at a uniform sampling interval, with an n-th sampling interval denoted by "n." In a multi-bit DAC, to produce an analog signal, the outputs of the individual unit elements 120a-120j may be coupled to a summing node, which may add the individual analog signals to produce the output analog signal. The output analog signal may, thus, have a value corresponding to the value of an input unary code (e.g., $d_u[n]$).

In conventional DEM, mismatches in the unit elements 120a-120j may introduce error in the output of analog signal. For example, each unit element 120a-120j may have a random amplitude error ($r_i$). At any sample, the total amplitude error ($e_{amp}(n)$) may be given by the sum of the product of each respective unary code ($u_i(n)$) and random amplitude error $r_i$, for an i-th unit element 120a-120j, as follows:

$$e_{amp}(n) = \Sigma_{i=1}^{j} u_i(n) \cdot r_i \qquad \text{(Eq. 1)}$$

In further examples, each transition (e.g., 0 to 0, 0 to 1, 1 to 1, and 1 to 0) of each unit element 120a-120j may result in a respective transient error waveform ($e_{00i}, e_{01i}, e_{11i}, e_{10i}$). Ignoring clock feedthrough, it may be assumed that $e_{00i} = e_{11i} = 0$. Transition errors $e_{01i}$ and $e_{10i}$ may be decomposed into delay ($t_{del,i}$) and duty cycle ($t_{cyc,i}$) errors, where $e_{01i} = t_{cyc,i} - t_{del,i}$; and $e_{10i} = t_{cyc,i} + t_{del,i}$ for an i-th unit element 120a-120j. Thus, a total delay error ($e_{del}(n)$) and total duty-cycle error ($e_{cyc}(n)$) may be given as follows:

$$e_{del}(n) = \Sigma_{i=1}^{j} (u_i(n) - u_i(n-1)) \cdot t_{del,i} \qquad \text{(Eq. 2)}$$

and $$e_{cyc}(n) = \Sigma_{i=1}^{j} |u_i(n) - u_i(n-1)| \cdot t_{cyc,i} \qquad \text{(Eq. 3)}$$

Harmonic distortion may be introduced by these errors, as $e_{amp}(n)$, $e_{del}(n)$, and $e_{cyc}(n)$ may have the same periodicity as the digital input. Thus, a constant transition rate DEM scheme may be implemented via the CTR-DEM logic 110, which is described in further detail below with respect to FIG. 2.

Figure 2:
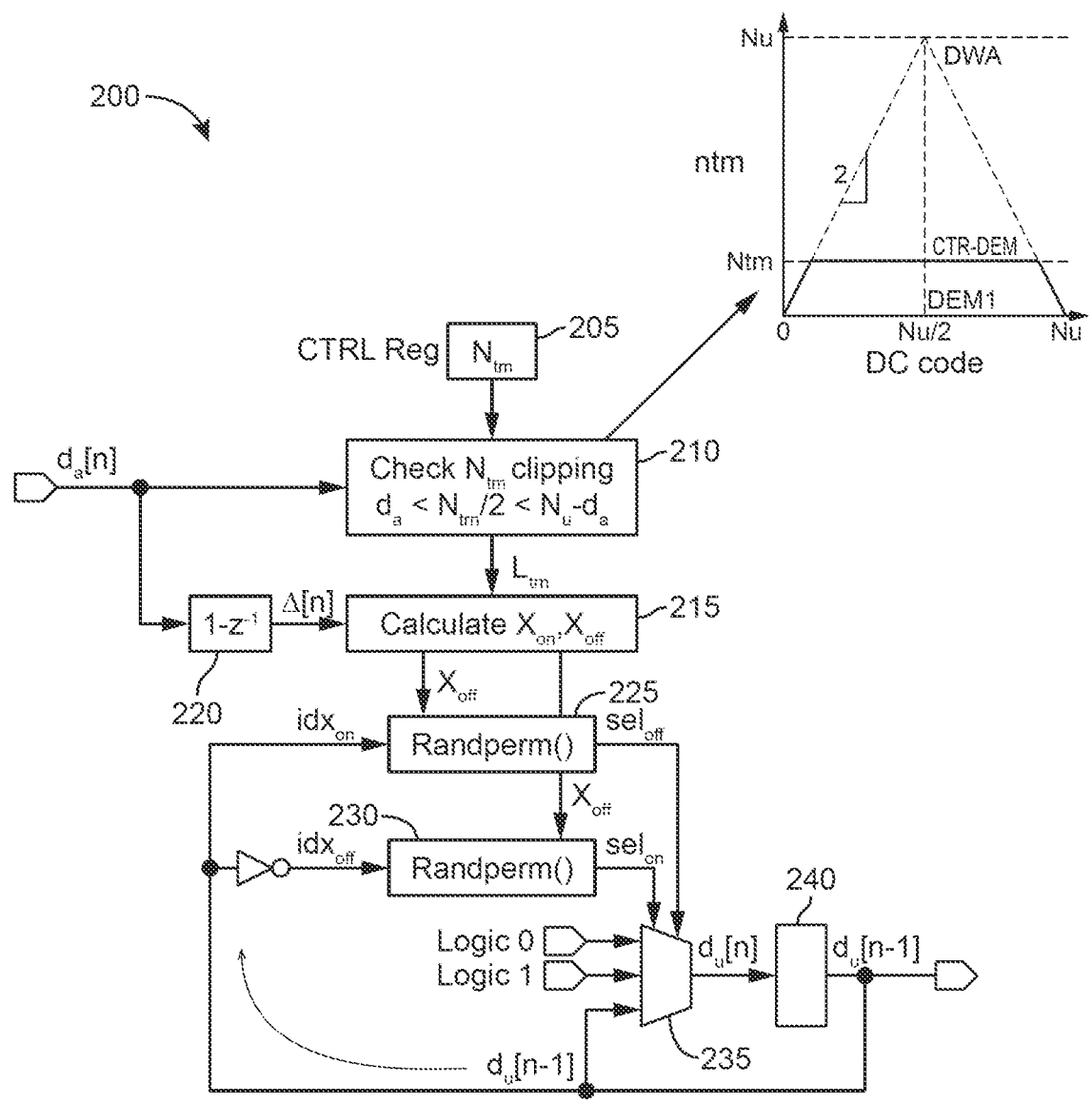
FIG. 2 is a schematic diagram of a transition aware dynamic element matching encoder logic circuit for use in the digital-to-analog converter system illustrated in FIG. 1, in accordance with various embodiments.

FIG. 2 is a schematic diagram of a transition aware dynamic element matching encoder logic circuit 200, in accordance with various embodiments. The encoder logic circuit 200 includes a control register 205, a clipping detection logic 210, an on/off calculation logic 215, difference block 220, first random permutation logic 225, second random permutation logic 230, multiplexer 235, and flip-flop 240. It should be noted that the various components of the logic circuit 200 are schematically illustrated in FIG. 2, and that modifications to the various components and other arrangements of logic circuit 200 may be possible and in accordance with the various embodiments. In various embodiments, encoder logic circuit 200 and its various logic and subcomponents may be implemented as hardware, such as digital logic and/or logic circuits, utilizing various hardware and logic components.

According to various embodiments, the control register 205 may store a 4-bit value of a constant transition rate. It is to be understood that the number of bits of the control register are not limited to 4-bits, and in some embodiments, may include more or less bits. In some further examples, the number of bits of the control register 205 may correspond to the value of the constant transition rate.

In various examples, the constant transition rate may indicate a number of transitions ($N_{trn}$) to be performed at each sample interval. In some examples, $N_{trn}$ may be set as a static value, which may be a fixed number of transitions in the unary code, where the unary code is further based on an input code (e.g., digital input $d_a[n]$). In some examples, $N_{trn}$ may be determined based on an amplitude of the delta code, which may be given by:

$$\Delta[n] = \text{code}(n) - \text{code}(n-1) \qquad \text{(Eq. 4)}$$

where code(n) and code(n-1) are the input code, and may be used interchangeably with input code "$d_a[n]$" and "$d_a[n-1]$."

In further examples, $N_{trn}$ may be an adjustable value. For example, in some embodiments, $N_{trn}$ may be set by a user. In other examples, $N_{trn}$ may be adjusted on-the-fly and/or in real-time based on system requirements and/or metrics. For example, in some embodiments, the DAC may receive feedback from a receiver requesting an increase or decrease in amplitude (e.g., power). The DAC may, accordingly, increase $N_{trn}$ in response to a request to increase amplitude, and decrease $N_{trn}$ response to a decrease in amplitude. In the case of modulated data, for example, in a wireless DAC, $N_{trn\_opt}$ may be determined as a function of carrier frequency and the type of data being transmitted. For example, a data signal may exhibit a peak to average ratio, which may be used to set an optimal $N_{trn}$.

As previously described, in some embodiments, $N_{trn}$ may be a hard-coded value. In some examples, the hard-coded value may be determined based on known signal characteristics for a given use case or for one or more common applications. In some examples, an optimal number of transitions, $N_{trn\_opt}$, may be set equal to a maximum value of the delta code: $\max(\Delta(n))$. This may result in an error profile with no HD2 and a minimum noise floor needed to suppress HD2.

In various examples, an optimal $N_{trn\_opt}$ may be directly proportional to the amplitude of the digital input $P_{sig}$, and frequency of the digital input $F_{sig}$. The selection of $N_{trn}$ and its effects are described in further detail below, with respect to FIG. 4.

In some examples, clipping detection logic 210 may be configured to check for $N_{trn}$ clipping. In some embodiments, the clipping detection logic 210 may receive the digital input $d_a[n]$ and $N_{trn}$, and compare the two inputs to ensure the condition $d_a < N_{trn}/2 < N_u - d_a$ is met, where $N_u$ is the number of unit elements. In some embodiments, the clipping detection logic 210 may receive the digital input $d_b[n]]$ and $N_{trn}$, and compare the two inputs to ensure the condition $d_b < N_{trn}/2 < N_u - d_b$ is met, where $N_u$ is the number of unit elements. The digital input is described below as being digital input $d_a[n]$ for simplicity and can be replaced by the digital input $d_b[n]$ in the following description. Thus, clipping detection logic 210 may ensure an $N_{trn}$ is selected such that there are enough unit elements that can be transitioned to generate the correct unary coded output, $d_u[n]$. For example, if an $N_{trn}$ is selected that is too large (e.g., $N_{trn}/2 > N_u - d_a$), then there is a smaller range of digital input values $d_a$ for which $N_{trn}$ may be enforceable. Thus, if $N_{trn}$ is too high, in some examples, $N_{trn}$ may be reduced. On the other hand, if $N_{trn}$ is too low, then HD2 and other harmonic distortion may appear. In some examples, if $N_{trn}$ is too low, the clipping detection logic may be configured to add additional transitions (e.g., $N_{trn}+1$), without affecting the absolute value of the unary coded output. Accordingly, in various examples, a value $N_{trn}$ that falls within the range $d_a < N_{trn}/2 < N_u - d_a$ may be output by the clipping detection logic 210 as the signal $L_{trn}$.

In some alternative embodiments, the DAC (such as DAC 115) may further include one or more redundant unit elements. In some embodiments, the one or more redundant unit elements may be switched on or off as needed to avoid clipping. In some examples, the one or more redundant elements may act as "zero padding" for the input code, and remain in an off state (or in some examples an on state) until the one or more redundant unit elements are needed to enforce $N_{trn}$ transitions for a given input code, even as the code approaches 0 code (e.g., an all "0" code) or full code (e.g., an all "1" code). In this configuration, $L_{trn}$ may be equal to $N_{trn}$, and the bit-width j of the unary code $d_u[n]$ may be increased by the number of redundant DAC unit (k). Accordingly, for an m-bit input code, the number of bits j may be given by: $j=(2^m-1)+k$. In some examples, the one or more redundant unit elements may be provided alongside clipping detection logic 210. In other embodiments, the clipping detection logic 210 may be skipped, and the one or more redundant unit elements used instead.

In various embodiments, the on/off calculation logic 215 may be configured to calculate a number of unit elements to be turned on ($X_{on}$) and a number of unit elements to be turned off ($X_{off}$). Specifically, $X_{on}$ and $X_{off}$ may correspond to the number of unit elements to be switched on or off of the $L_{trn}$ number of transitions. Thus, in some examples, $X_{on}+X_{off}=L_{trn}$. In some embodiments, being turned on refers to a unit element being in an active state or contributing to the production of the analog output signal, and being turned off refers to a unit element being in an passive state or not contributing to the production of the analog output signal. The turned off state is a lower power consuming state than the turned on state. In some embodiments, a unit element can be turned off by placing a transistor in in the unit element in a non-conducting state and can be turned on by placing the transistor in a conductive state.

The on/off calculation logic 215 may be configured to receive, from difference block 220, a delta code $\Delta[n]$. Accordingly, in some examples, the difference block 220 may be a first difference backward z-transform, configured to determine a difference from a current code (e.g., digital input $d_a[n]$) and the previous code (e.g., digital input from the previous cycle $d_a[n-1]$). In this example, the previous cycle may refer to a previous sample interval of the DAC, such as DAC 115 and/or DAC system 100 of FIG. 1. As with the other components of the encoder logic circuit 200, the difference block 220 may also be a logic circuit. In some examples, the difference block 220 may be implemented using a register (e.g., one or more D-flip flops).

The on/off calculation logic 215 may thus determine, based on the delta code ($\Delta[n]$) and $L_{trn}$ a number of unit elements to be turned on during the transition, and the number of unit elements to be turned off. Thus, once the number of transitions $L_{trn}$ is determined, the change from the previous code (e.g., the delta code) may be used to determine how many additional unit elements need to be switched on or off. For example, if the delta code is 1, one additional unit may need to be turned on. Thus, the on/off calculation logic may set $X_{on}$ to be 1 more than $X_{off}$. Accordingly, in some examples, the relationship between $X_{on}$ and $X_{off}$ may be expressed as: $X_{on}=X_{off}+\Delta[n]$.

The number of units that need to be turned off, $X_{off}$, may be provided to first random permutation logic 225, and the number of units that need to be turned on, $X_{on}$, may be provided to second permutation logic 230. In various examples, the first and second random permutation logic 225, 230 may include various types of randomization and/or stochastic selection algorithms for randomizing and/or selecting individual unit elements to be switched on or off utilizing a respective algorithm (e.g., a random and/or stochastic algorithm for selecting the specific bit positions associated with individual unit elements of a plurality of unit elements to be switched). In some examples, the first and second random permutation logic 225, 230 may include various types of DEM algorithms, including, without limitation, random averaging, clocked averaging, individual level averaging, data weighted averaging, etc.

The first random permutation logic 225 may be configured to determine which individual unit elements should be turned off (e.g., unit elements to be switched off that were previously on) based on the input $X_{off}$ indicating the number of unit elements to be switched off, and a signal indicating which individual unit elements were turned on ($idx_{on}$) during a previous cycle (e.g., a previous sampling interval). Specifically, the first random permutation logic 225 may indicate which specific unit elements of $idx_{on}$ should be turned off during the current sampling interval. In some examples, $idx_{on}$ may be equal to the input unary code of the previous cycle, $d_u[n-1]$. Thus, in some examples, the first random permutation logic 225 may select an $X_{off}$ number of specific individual unit elements to be turned off from the unit elements indicated to have been on by the signal $idx_{on}$. For example, the specific individual unit elements to be turned off may be selected from $idx_{on}$ according to a randomization and/or stochastic selection algorithm (e.g., a dynamic element matching algorithm). The first random permutation logic 225 may then output a signal indicative of which unit elements have been selected to be turned off, $sel_{off}$.

The second random permutation logic 230 may be configured to determine which individual unit elements should be turned on (e.g., unit elements to be switched on that were previously off), based on the input $X_{on}$, indicating the number of unit elements to be switched on, and a signal indicating which of the individual unit elements were turned off ($idx_{off}$) during the previous cycle. Specifically, the second random permutation logic 230 may indicate which specific unit elements of $idx_{off}$ should be turned on during the current sampling interval. Accordingly, in some examples, $idx_{off}$ may be equal to the inverse of $d_u[n-1]$. In some examples, the second random permutation logic 230 may select an $X_{on}$ number of specific individual unit elements to be turned on from the unit elements indicated to have been off by the signal $idx_{off}$. For example, the specific individual unit elements to be turned on may be selected from $idx_{off}$ according to the randomization and/or stochastic selection algorithm. The second random permutation logic 230 may output a signal indicative of which unit elements have been selected to be turned on, $sel_{on}$.

In some examples, the output signals, $sel_{on}$ and $sel_{off}$, may be provided to multiplexer 235 as control signals for selecting between inputs of the multiplexer 235. Specifically, the input of the multiplexer 235 may include the input unary code of the previous cycle, $d_u[n-1]$ input, logic 1 (e.g., logic high), and logic 0 (e.g., logic low). According to some examples, $sel_{off}$ in the i-th bit position ($sel_{off,i}$) may equal 1 if the corresponding i-th unit element is to be turned off, and set equal to 0 when there is no change. Similarly, $sel_{on}$ in the i-th bit position ($sel_{on,i}$) may be equal 1 if the corresponding i-th unit element is to be turned on, and set equal to 0 when there is no change. In some examples, $sel_{off,i}$ and $sel_{on,i}$ may form a 2-bit control signal to the multiplexer for selecting the various inputs. Thus, if an i-th unit element of the DAC is to be switched off, a control signal of 10 may be generated, indicating that logic 0 should be output by the multiplexer 235. Similarly, if the i-th unit element of the DAC is to be switched on, a control signal of 01 may be generated, indicating that logic 1 should be output by the multiplexer 235. If a control signal of 00 is output, it may indicate that no transition should take place for the i-th unit element, and the unary code of the previous cycle in the i-th position, $d_{u,i}[n-1]$, may be output by the multiplexer 235. In this way, the multiplexer 235 may generate new input unary code for a current cycle, $d_u[n]$. The current input unary cycle may then be stored at flip-flop 240. In some examples, the flip-flop 240 may be clocked by a clock signal having a period equal to a sample interval (e.g., a sampling clock).

In this way, the encoder logic circuit 200 may generate an input unary code to switch unit elements of the DAC on and off according to a CTR-DEM scheme. Specifically, under the CTR-DEM framework, a constant number of transitions may be enforced (e.g., a constant number of transitions may be consistently performed at each sampling interval/cycle), with transition awareness—that is, awareness of whether a given unit element will undergo a transition from on to off, or off to on.

Figure 3:
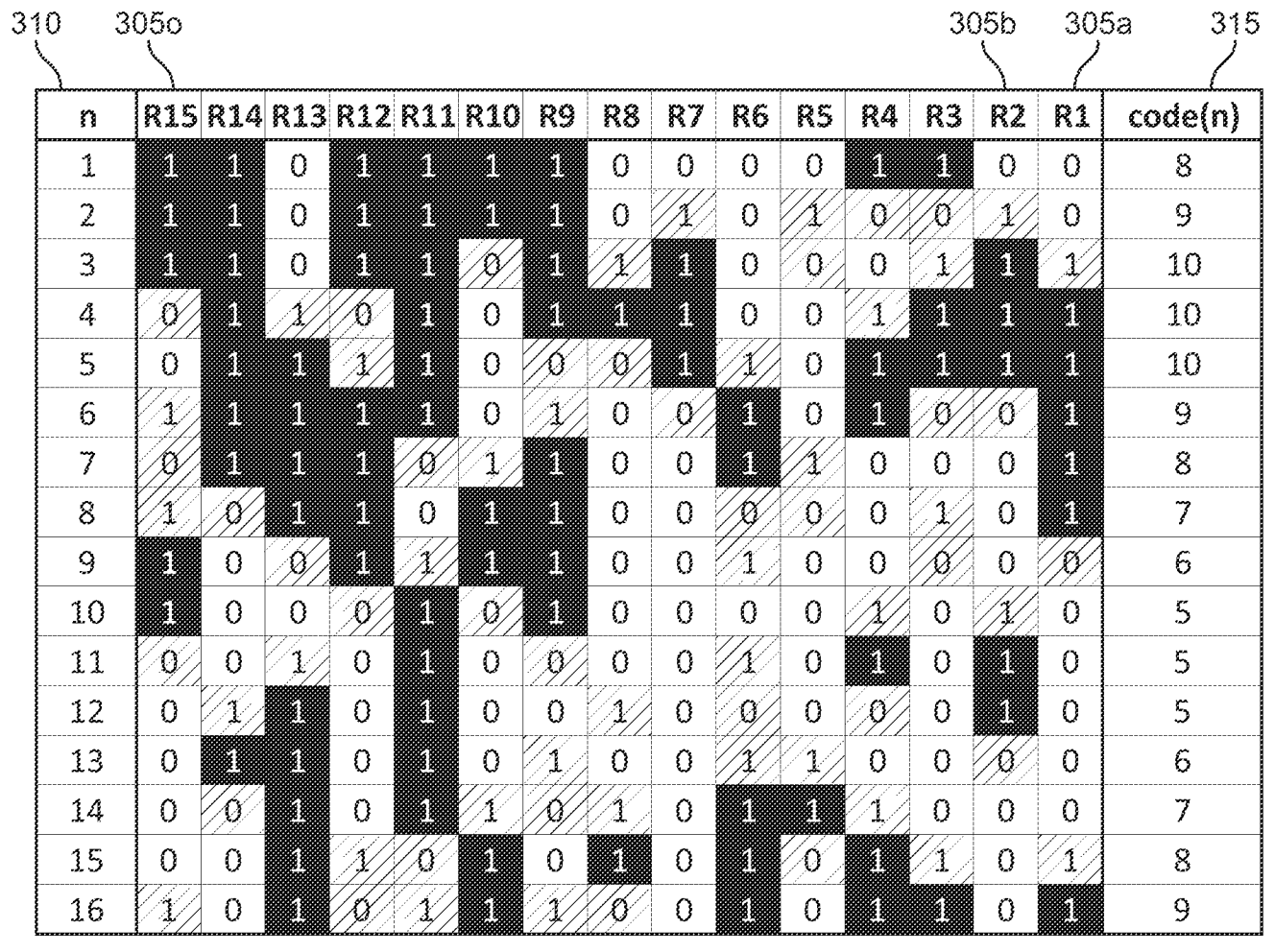

FIG. 3 is a schematic diagram illustrating a flow 300 of transition aware dynamic element matching, in accordance with various embodiments. Specifically, FIG. 3 illustrates, in tabular form, individual unit elements 305a-305o, which includes a first unit element R1 305a through a fifteenth unit element R15 305o. Column "n" 310 may correspond to a cycle or sample interval, where n=1 may correspond to a first cycle, and so on and so forth. Code(n) 315 may correspond to the value of digital input $d_a[n]$ during the n-th cycle. The columns under each of the unit elements, R1 305a-R15 305o, may illustrate whether the respective unit element is on or off, and a corresponding bit of the unary code (e.g., $d_u[n]$) in the respective bit position corresponding to that unit element. A shaded square may indicate that the unit element is turned on, and the number 1 may indicate that the value of the unary code in the respective bit position is 0. A blank square may indicate that the unit element is turned off, and the number 0 may indicate that the value of the unary code in the respective bit position is 0. For example, for the first cycle n=1, when read across the entire row, the unary code $d_u[1]=110111100001100$, corresponding to the code(n) value of 8 (e.g., $d_a[1]=1000$).

Unit element transitions (e.g., from on to off, or off to on) are depicted as hatch-marked shaded squares (e.g., indicating a transition from off to on) and hatch-marked empty square (e.g., indicating a transition from on to off). In the illustrated example, an $N_{trn}=5$ is adopted. Thus, for each cycle, an $N_{trn}$ of 5 transitions is enforced (e.g., consistently performed at each cycle), corresponding to 5 transitions. For example, in the transition from n=1 to n=2, the code(n) value changes from code(1)=8 (alternatively, $d_a[1]=1000$) to code (2)=9 (alternatively, $d_a[2]=1001$). Accordingly, under CTR-DEM, to enforce an $N_{trn}$ of 5 transitions, $X_{on}=3$ and $X_{off}=2$ is used. Thus, the input unary code changes from $d_u[1]=110111100001100$ to $d_u[2]=110111101010010$, where R7, R5, and R2 are selected to be turned on from an off state (e.g., transition to an on state), and R4 and R3 are selected to be turned off from an on state (e.g., transition to an off state). In this way, the CTR-DEM scheme may continue, so on and so forth, through each of the remaining cycles n=3 through n=16.

Figure 4:
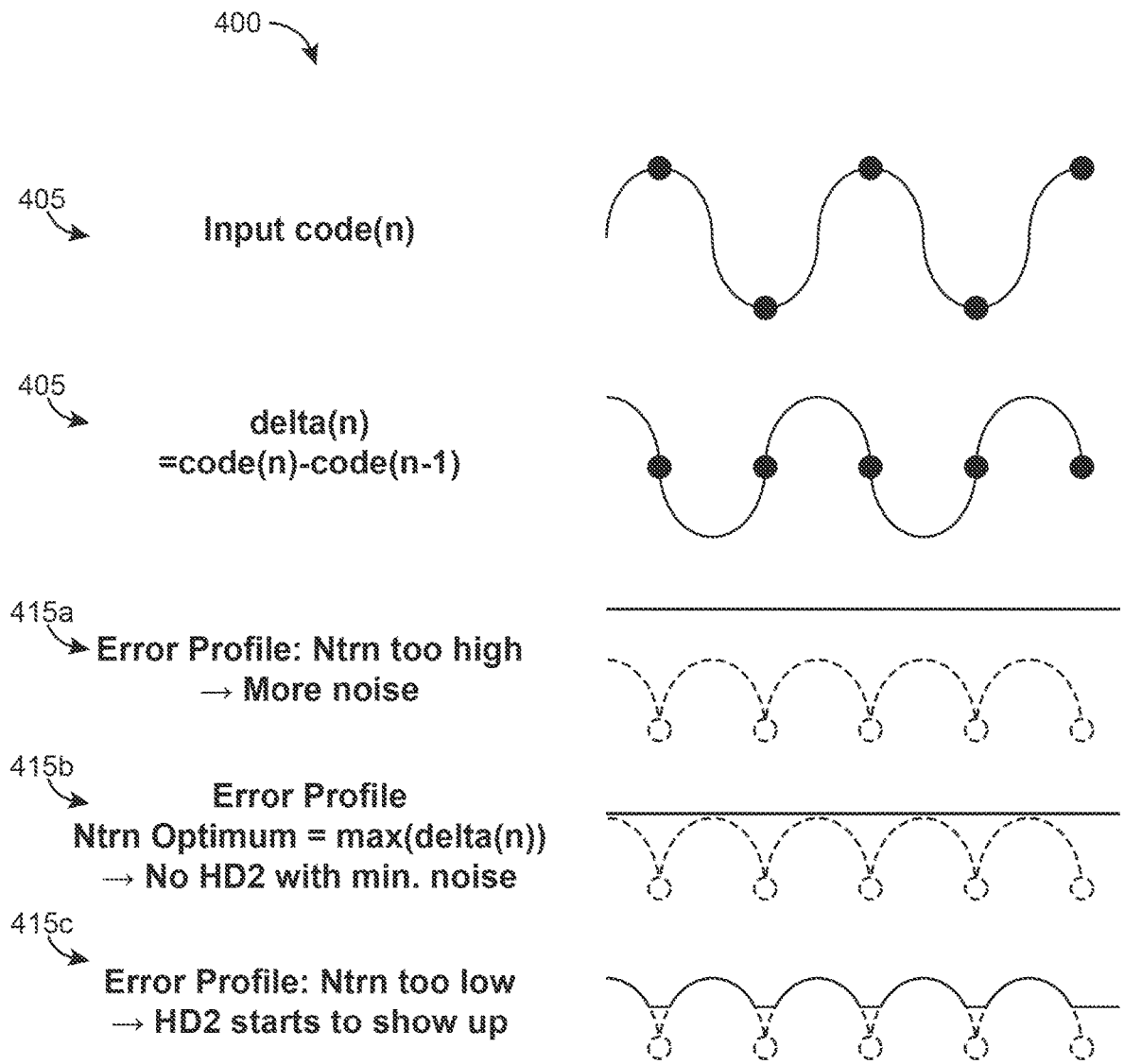
FIG. 4 is a timing diagram illustrating the relationship between the number of transitions and timing error, in accordance with various embodiments.

FIG. 4 is a timing diagram 400 illustrating the relationship between the number of transitions and timing error, in accordance with various embodiments. The timing diagram 400 includes an input code(n) waveform 405, delta(n) waveform 410, and error profile waveforms 415a-415c.

Conventional DEM attempts to break the static deterministic relationship between the digital input, code(n) (also referred to as $d_a[n]$), and unary code $u_i(n)$ (also referred to as $d_u[n]$), where $u_i(n)$=B2T(code(n)), where B2T is a binary-to-thermometer code conversion. Instead, a dynamic relationship is created, where $u_i(n)$=DEM(code(n)), which converts amplitude errors ($r_i$), delay errors ($t_{del,i}$), and duty-cycle errors ($t_{cyc,i}$) to noise instead of harmonic distortion (HDx). Generally, DEM can increase switching activity, leading to higher RMS values of total delay error $e_{del}(n)$ and total duty-cycle error $e_{cyc}(n)$, and increased degradation to SNDR. Thus, with conventional DEM, spurious free dynamic range (SFDR) may be improved at the expense of some degradation in signal-to-noise and dispersion ratio (SNDR), and while HD2 remains.

As can be seen in the error profile waveforms 415a-415c, with conventional DEM, error introduced due to duty-cycle mismatch may be the same for rising edge transitions and falling edge transitions. Thus, the duty-cycle error may be seen to have an error profile given by the absolute value of the delta(n) (used interchangeably with "delta code," and "Δ[n]"), exhibiting a 2× signal frequency pattern. Thus second harmonic distortion (HD2) may remain under a conventional DEM scheme.

Accordingly, a CTR-DEM scheme may enforce a constant transition rate, with $N_{trn}$ transitions of unit elements each cycle. By enforcing a constant number of unit element transitions, or additional transitions where necessary (e.g., $\sim N_{trn}$ or $N_{trn+i}$), this may mitigate DAC switching current ($I_{sw}$) and pre-driver ISI for $N_{trn}$ relative to the absolute value of delta(n). Moreover, CTR-DEM may perform a fixed number of transitions irrespective of code or delta code. Thus, removing dependency on the code spreads the error as noise instead of a spur.

Error profile waveform 415a illustrate an example in which $N_{trn}$ is set too high. Because $N_{trn}$ is too high, an increase in the noise floor is exhibited. In various examples, a constant transition rate may be realized with an $N_{extra}$ number of "extra" switches that are more than needed to produce a given delta code (e.g., abs(delta(n))). Thus, the extra switching may be given as: $N_{extra}=N_{trn}$–abs(delta(n)), where abs(delta(n)) is the absolute value of delta(n). $N_{extra}$ may always be an even value, such that any transition turning off a cell that was on is matched with corresponding transition turning on a cell that was off.

Error profile 415b illustrates an example where an $N_{trn\_opt}$ is utilized. Here, $N_{trn\_opt}$ is set equal to max(delta(n)). This may result in an error profile with no HD2 and a minimum noise floor needed to suppress HD2. The optimum $N_{trn}$ may be directly proportional to the amplitude and frequency of the input code/signal. Error profile 415c is an example in which $N_{trn}$ is set too low. Because $N_{trn}$ is too low, the peaks of abs(delta(n)) may remain exposed, leading to the appearance of HD2 spurs.

Thus, by tuning the $N_{trn}$, the proposed CTR-DEM may realize improved SNDR over conventional DEM, close to no-DEM levels, while removing all mismatch related spurs. By tuning $N_{trn}$, CTR-DEM has the ability to maintain optimal SNDR across different power levels, carrier frequencies, etc., thereby creating a lower noise floor that scales with signal power and carrier frequency, while also improving SFDR. In some examples, tuning (e.g., adjusting) of $N_{trn}$ may further include checking for $N_{trn}$ clipping, as described above with respect to clipping detection logic 210 of FIG. 2.

Figure 5:
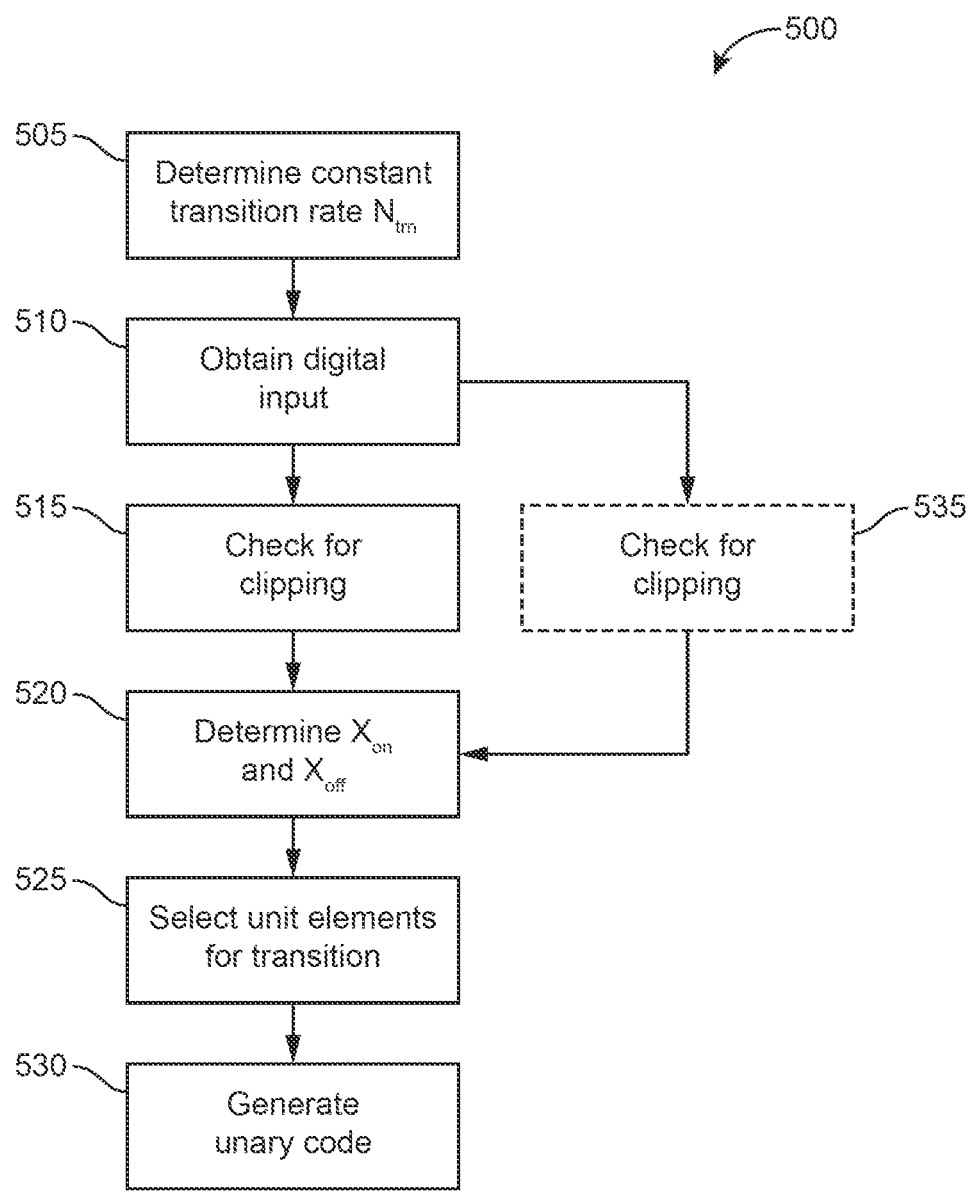
FIG. 5 is a flow diagram of a flow for transition aware dynamic element matching, in accordance with various embodiments.

FIG. 5 is a flow diagram of a flow 500 for transition aware dynamic element matching, in accordance with various embodiments. The flow 500 begins, at block 505, by determining a constant transition rate ($N_{trn}$). As previously described, in some examples, $N_{trn}$ may be a number of transitions to be performed. For example, a transition may indicate a change in state of a unit element from an off state to an on state, or an on state to an off state, wherein the state of a unit element, as used herein, may refer to whether the unit element is on (e.g., on state) or off (e.g., off state). In the CTR-DEM logic, the number of transitions may be the number of transitions in the unary code from a previous cycle (e.g., 1 to 0, or 0 to 1).

In some examples, $N_{trn}$ may be set as a static value. In other examples, $N_{trn}$ may be an adjustable value. For example, in some embodiments, $N_{trn}$ may be set by a user. In other examples, $N_{trn}$ may be adjusted on-the-fly and/or in real-time based on system requirements and/or metrics. In yet further embodiments, $N_{trn}$ may be a hard-coded value. In some examples, the hard-coded value may be determined based on known signal characteristics for a given use case or for one or more common applications. Tuning of $N_{trn}$ to an optimal value is further discussed above, with respect to FIGS. 2 and 4. In some examples, $N_{trn}$ may be determined based on a maximum amplitude of a delta code, plus an $N_{extra}$ number of extra transitions, as previously described.

The flow 500 may continue, at block 510, by obtaining a digital input (e.g., $d_a[n]$) for a current cycle (e.g., a current sampling interval of a DAC). In various examples, the digital input may be a binary-coded digital signal indicating a signal to be converted to an analog signal. In some examples, the digital input for the current cycle may be compared against the digital input from a previous cycle (e.g., $d_a[n-1]$) to determine a delta code, as previously described.

At block 515, the flow 500 continues by checking for clipping. In some examples, $N_{trn}$ may be checked for clipping based on the digital input. Specifically, $N_{trn}$ may be compared against the value of the digital input, $d_a$, to ensure a corresponding unary code can be generated by an $N_{trn}$ number of transitions. In some examples, clipping may be checked by ensuring the condition: $d_a < N_{trn}/2 < N_u - d_a$. In some examples, if clipping is detected, the number of transitions, $N_{trn}$, may be reduced. On the other hand, if $N_{trn}$ is too low, then HD2 and other harmonic distortion may appear. In some examples, if $N_{trn}$ is too low, the clipping detection logic may be configured to add additional transitions (e.g., $N_{trn}+1$).

In some embodiments, the flow 500 may further include, at block 535, alternatively and/or additionally utilizing one or more redundant unit elements. As previously described, in some examples, the DAC may further include one or more redundant unit elements. In such embodiments, the one or more redundant unit elements may be switched on or off as needed to avoid clipping. In some examples, the one or more redundant elements may act as "zero padding" for the input code, and remain in an off state (or in some examples an on state) until the one or more redundant unit elements are needed to enforce $N_{trn}$ transitions for a given input code, even as the code approaches 0 code (e.g., an all "0" code) or full code (e.g., an all "1" code). In this configuration, $L_{trn}$ may be equal to $N_{trn}$. Thus, in some examples the check for clipping described above may be skipped, and the one or more redundant unit elements used instead. In other embodiments, the one or more redundant unit elements may be utilized in combination with the check for clipping.

At block 520, the flow 500 continues by determining a number of unit elements to be switched on (from an off state), $X_{on}$, and number of unit elements to be switched off (from an on state), $X_{off}$. In some examples, $X_{on}$ and $X_{off}$ may be determined based on the delta code $\Delta[n]$. For example, the delta code may indicate a change in the digital signal from a previous cycle. Thus, the delta code may indicate a decrease in the input code, which may correspond to a number of additional unit elements to be turned off, or an increase in the input code, which may correspond to a number of additional unit elements to be turned on. Accordingly, in some examples, the relationship between $X_{on}$ and $X_{off}$ may be expressed as: $X_{on}=X_{off}+\Delta[n]$. When $\Delta[n]$ is positive, indicating an increase in the digital input, the number of unit elements to be switched on (e.g., $X_{on}$) may be $\Delta[n]$ more than the number of unit elements to be switched off (e.g., $X_{off}$). Conversely, when $\Delta[n]$ is negative, indicating a decreased digital input value, $X_{on}$ may be smaller than $X_{off}$ by $\Delta[n]$.

The flow 500 continues, at block 525, by selecting unit elements for transition. In various embodiments, random permutation logic may be implemented to select individual unit elements for transition from an on to an off state (based on $X_{off}$), and from an off to an on state (based on $X_{on}$). As previously described, random permutation logic may include various types of DEM algorithms, including, without limitation, random averaging, clocked averaging, individual level averaging, data weighted averaging, etc., for randomizing and/or selecting individual unit elements to be switched on or off. In yet further embodiments, random permutation logic may alternatively include or be replaced by a deterministic DEM algorithm. For example, the elements that are switched may be evenly distributed over time according to a deterministic pattern and/or sequence, such that timing error attributable to individual unit elements are evenly spread for specific transitions. For example, for an $N_{trn}$ number of transitions, the $idx_{on}$ and/or $idx_{off}$ may be adjusted by the random permutation logic to follow a deterministic pattern and/or sequence of which bits (e.g., corresponding unit elements) are to be switched on or switched off.

In some examples, a first permutation logic circuit may be configured to determine which individual unit elements should be turned off (e.g., unit elements to be switched off that were previously on), based on the input $X_{off}$, indicating the number of unit elements to be switched off, and a signal indicating which individual unit elements were turned on ($idx_{on}$) during a previous cycle (e.g., a previous sampling interval). Accordingly, in some examples, $idx_{on}$ may be equal to the input unary code of the previous cycle, $d_u[n-1]$. Thus, in some examples, the first random permutation logic circuit may select $X_{off}$ number of unit elements to be turned off from the unit elements indicated to have been on by the signal $idx_{on}$ according to a randomization and/or stochastic selection algorithm (e.g., a dynamic element matching algorithm). The first random permutation logic may then output a signal indicative of which unit elements have been selected to be turned off, $sel_{off}$. A unary code refers to an entropy encoding that represents a number n with a code length generally equal to n+1 or n. In some embodiments, the unary code is used to control DAC cells or unit elements.

The second random permutation logic may be configured to determine which individual unit elements should be turned on (e.g., unit elements to be switched on that were previously off), based on the input $X_{on}$, indicating the number of unit element to be switched on, and a signal indicating which of the individual unit elements were turned off ($idx_{off}$) during the previous cycle. Accordingly, $idx_{off}$ may be equal to the inverse of $d_u[n-1]$. Thus, in some examples, the second random permutation logic may select $X_{on}$ number of unit elements to be turned on from the unit elements indicated to have been off by the signal $idx_{off}$ according to a randomization and/or stochastic selection algorithm (e.g., dynamic element matching algorithm). The second random permutation logic may output a signal indicative of which unit elements have been selected to be turned on, $sel_{on}$.

The flow 500 further includes, at block 530, generating unary code for the current cycle. In various examples, the unary code for the current cycle may be generated based on the $sel_{on}$ and $sel_{off}$ outputs indicating the selected units for transitions. As previously described, in some examples, the output signals, $sel_{on}$ and $sel_{off}$, may be provided to a multiplexer as control signals for selecting between inputs of the multiplexer. Specifically, the inputs of the multiplexer may include the input unary code of the previous cycle, $d_u[n-1]$ input, logic 1 (e.g., logic high), and logic 0 (e.g., logic low). According to some examples, $sel_{off}$ in the i-th bit position ($sel_{off,i}$) may be equal 1 if the corresponding i-th unit element is to be turned off, and set equal to 0 when there is no change. Similarly, $sel_{on}$ in the i-th bit position ($sel_{on,i}$) may be equal 1 if the corresponding i-th unit element is to be turned on, and set equal to 0 when there is no change. In some examples, $sel_{off,i}$ and $sel_{on,i}$ may form a 2-bit control signal to the multiplexer for selecting the various inputs. Thus, if an i-th unit element of the DAC is to be switched off, a control signal of 10 may be generated, indicating that logic 0 should be output by the multiplexer. Similarly, if the i-th unit element of the DAC is to be switched on, a control signal of 01 may be generated, indicating that logic 1 should be output by the multiplexer. If a control signal of 00 is output, it may indicate that no transition should take place for the i-th unit element, and the unary code of the previous cycle in the i-th position, $d_{u,i}[n-1]$, may be output by the multiplexer. In this way, in some examples, the multiplexer may generate new input unary code for a current cycle, $d_u[n]$. In further examples, the current input unary cycle may then be stored, for example, at a flip-flop, where the flip-flop may be clocked by a clock signal having a period equal to a sample interval. In yet further embodiments, generation of the unary code may be performed through logic or components other than the multiplexer. For example, so long as the generated unary code reflects the transitions of the unit elements (e.g., to be switched on and switched off), based on the signals $sel_{off}$ and $sel_{on}$, other suitable circuitry may be used to generate unary code $d_u[n]$ described above. Accordingly, in further examples, the states of each unit element of a DAC may be controlled according to the unary code, as previously described with respect to FIG. 3.

The techniques and processes described above with respect to various embodiments may be performed by one or more of system 100 and/or subsystems and components thereof, such as transition aware DEM encoder logic circuit 200 as described above with respect to FIGS. 1-2, and which may perform the methods provided by various other embodiments, as described herein.

Figure 6:
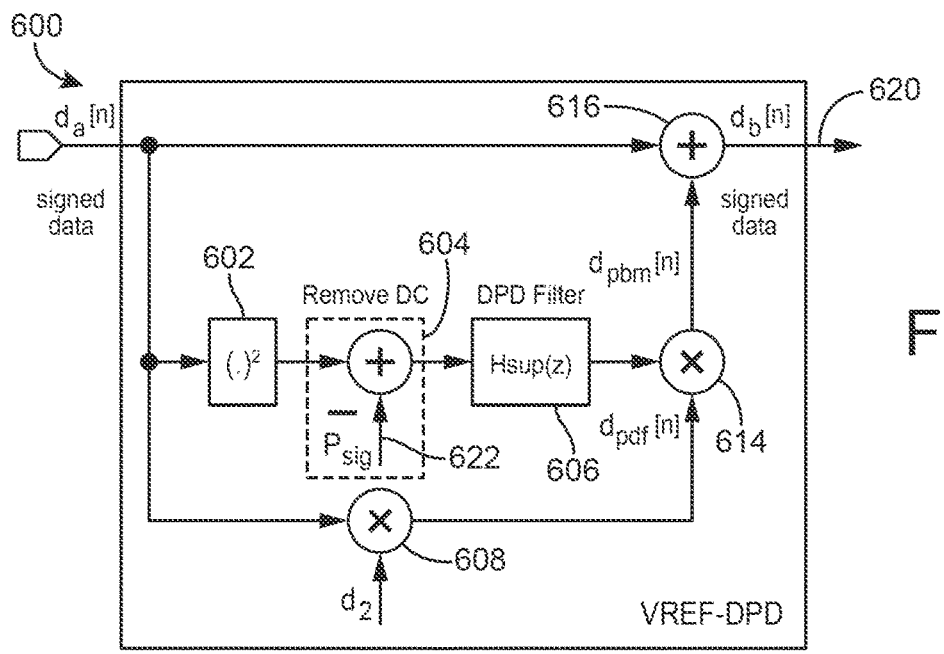
FIG. 6 is a schematic block diagram of a current signal distortion mitigation circuit for use in the digital-to-analog converter system illustrated in FIG. 1, in accordance with various embodiments.

With reference to FIG. 6, a digital pre-distortion circuit 600 can be used as current signal distortion mitigation circuit 104 (FIG. 1). In some embodiments, digital pre-distortion circuit 600 is coupled to input 101 (FIG. 1) which receives the digital input $d_a[n]$ and provides digital input $d_b[n]$ at output 107 for use by encoder 105 (FIG. 2). Digital pre-distortion circuit 600 includes a multiplier 602 configured as a squaring circuit, an adder 604 configured as a subtractor, a filter 606 configured a digital pre-distortion filter, a multiplier 608, a multiplier 614, and an adder 616. In various examples, digital pre-distortion circuit 600 may be implemented in hardware, software, or a combination of hardware and software. In some examples, digital pre-distortion circuit 600 may be implemented, without limitation, as a circuit (including logical circuits), application specific integrated circuits (ASICs), custom integrated circuits (ICs), system on a chip (SoC), or field-programmable gate array (FPGA) implementations. In other examples, digital pre-distortion circuit 600 may be implemented as part of a DAC controller. For example, digital pre-distortion circuit 600 may be implemented as part of the firmware of a DAC controller.

In some embodiments, digital pre-distortion circuit 600 is configured to compensate for the term $(1-c_2(x_a)^2*Z_{SUP}(\tau))$ in the following equation which represents the voltage $V_{OUT}$ (at output 103): $V_{OUT} \approx x_a V_{REF} \approx x_a \times (1-c_2(x_a)^2*Z_{SUP}(\tau))$, where $x_a$ is associated with the digital input $d_a[n]$, the term $c_2$ is a coefficient, and $Z_{SUP}(\tau)$ is a model of the supply network frequency response. The term $x_a$ represents the normalized sign code where (code(n)-midcode)/midcode in some embodiments.

The supply network 116 is any circuit for providing current and/or voltage to the DAC 115 at a level $V_{REF}$. The circuit can include components such as diodes, transistors, resistors, capacitors or inductors and can have parasitic characteristics. In some embodiments, the supply network includes an on-chip low drop out (LDO) regulator with controllable and predictable impedance at the operating parameters of system 100. The supply network 116 can have parasitic capacitance, resistance, and inductance associated with its design. Impedance model $Z_{SUP}(\tau)$ includes features that account for such parasitic characteristics in some embodiments. Supply network response is a characteristic of the supply network 116 that causes an input to the supply network 116 to be changed to the output of the supply network 116. The supply network response can vary according to temperature, process variations, frequency, and other variables. The supply network response is characterized over frequency in some embodiments. The supply network response can involve changes to amplitude and phase of signals provided across the supply network 116 in some embodiments. In some embodiments, the supply network response is a response due to impedance which changes over frequency.

In some embodiments, digital pre-distortion circuit 600 is configured to multiply the digital input $x_a$ by the response of filter 606 or $h_{SUP}(nT)$. In some embodiments, the responses of impedance model $Z_{SUP}(\tau)$ and filter $h_{SUP}(nT)$ are matched to each other in the desired frequency range for system 100. The result of the multiplication by $h_{SUP}(nT)$ is: $V_{OUT} \approx x_a \times (1+d_2 x_a^2 * h_{SUP}(nT)) \times (1-c_2(x_a^{\wedge\wedge})^2 * Z_{SUP}(\tau))$ or $x_a \times (1+d_2 x_a^2 * h_{SUP}(nT) - c_2(x_a^{\wedge\wedge})^2 * Z_{SUP}(\tau) - d_2 x_a^2 * h_{SUP}(nT)*c_2(x_a^{\wedge\wedge})^2 * Z_{SUP}(\tau))$. The term $x_a^{\wedge\wedge}$ is $x_a$ hat which represents the new digital input data $d_b[n]$ and equals $x_a \times (1+d_2 x_a^2 * h_{SUP}(nT))$. If $Z_{SUP}(\tau)$ and $h_{SUP}(nT)$ are well matched, the terms $x_a^2 * h_{SUP}(nT)$ and $c_2(x_a^{\wedge\wedge})^2 * Z_{SUP}(\tau)$ are equal and the term $d_2 x_a^2 * h_{SUP}(nT) * c_2 (x_a^{\wedge\wedge})^2 * Z_{SUP}(\tau)$ is a very small term associated with intermodulation IMD5 which can be ignored such that $V_{OUT} \approx x_a \times 1$ according to some embodiments. In some embodiments, the new digital input data $d_b[n]$ is a digitally pre-distorted input signal. A digitally pre-distorted input signal is a digital input value that has been adjusted to reduce distortion (e.g. due to signal current $I_{sig}$ (code[n])). In some embodiments, $d_2$ is a gain coefficient.

Figure 7:
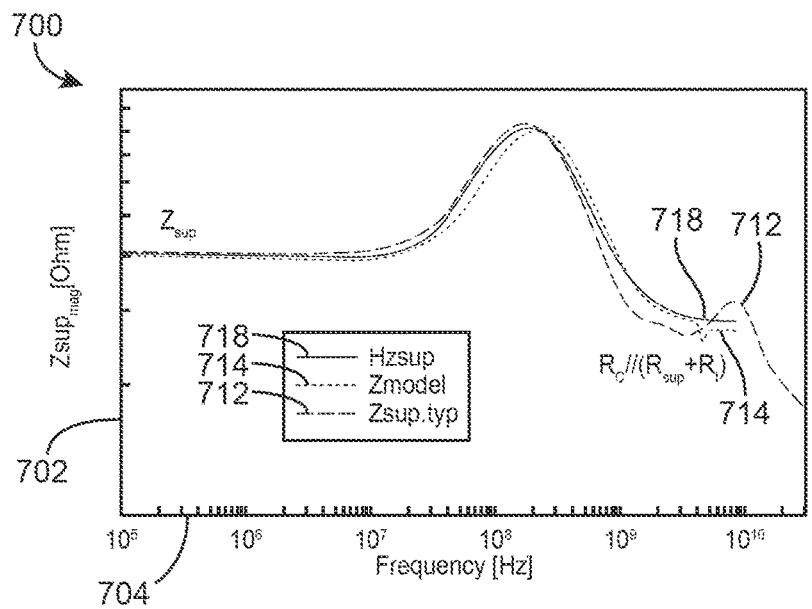
FIG. 7 is a diagram showing a frequency response for a filter in the current signal distortion mitigation circuit illustrated in FIG. 6, in accordance with various embodiments.

Multiplier 602, adder 604, filter 606, multiplier 608, multiplier 614, and adder 616 are configured to implement the above equation for digital input data $d_a[n]$ ($x_a^{\wedge\wedge}=(1+d_2 x_a^2 * h_{SUP}(nT))x_a$). In some embodiments, the coefficient $d_2$ is equal to $c_2 R_{SUPP}/(1+c_0 R_{SUPP})$ where $c_2$ and $c_0$ are constants and $R_{Supp}$ is a resistive value for an impedance model for the supply network 116 in some embodiments (see FIG. 8). Adder 604 is configured to remove direct current component due to the squaring operation by multiplier 602 using a signal at input 622 (a signal representing the direct current (DC) power of the code ($P_{sig}$)). The use of digital pre-distortion circuit 600 provides a 11.6 dBc improvement in HD3 distortion in a 1 tone test and a 30.5 dBc improvement in IMD3 distortion in a 2 tone test in some embodiments. It should be noted that the various components of the digital pre-distortion circuit 600 are schematically illustrated in FIG. 6, and that modifications to the various components and other arrangements of digital pre-distortion circuit 600 may be possible and in accordance with the various embodiments. Other equations can be implemented and other arrangements of components can implement the equation set form above according to some embodiments With reference to FIG. 7, a frequency response diagram 700 includes an X-axis 702 logarithmically representing impedance in ohms and a Y-axis 704 logarithmically representing frequency in hertz. A line 714 represents the impedance to frequency response for an example supply network 116 in some embodiments. A line 718 represents the impedance to frequency response for the filter 606 for the supply network 116 in some embodiments (see FIG. 8). A line 712 represents the impedance to frequency response for the impedance model for the supply network 116 in some embodiments (see FIG. 8). As shown in FIG. 7, the filter 606 can be configured to have a matching impedance to frequency response (line 718) to the impedance to frequency response of the supply network 116 (line 714) and model thereof (line 712) at certain frequencies of interest.

Figure 8:
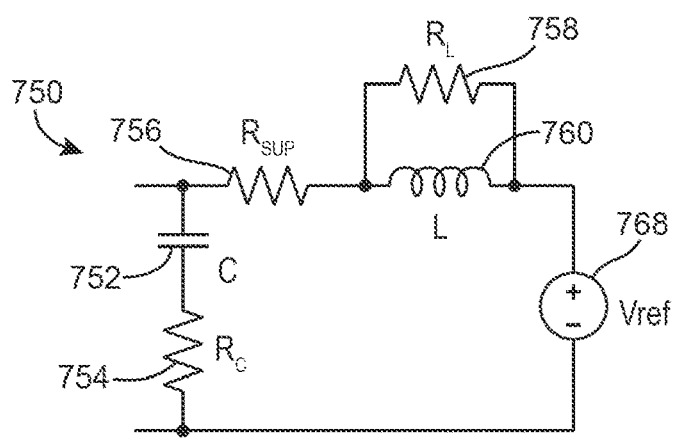
FIG. 8 is an electric schematic diagram of an impedance model for the filter having the frequency response illustrated in FIG. 7, in accordance with various embodiments.
Figure 9:
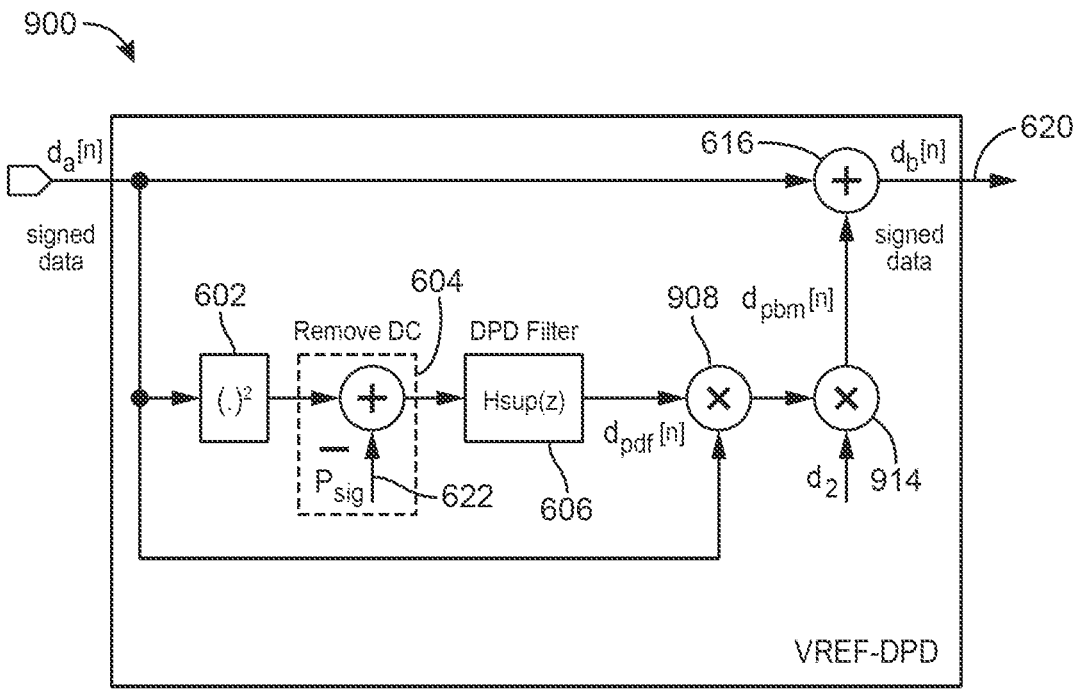
FIG. 9 is a schematic block diagram of a current signal distortion mitigation circuit for use in the digital-to-analog converter system illustrated in FIG. 1, in accordance with various embodiments.

With reference to FIG. 8, a model 750 of the supply network 116 (FIG. 1) associated with line 712 (FIG. 7) includes a capacitor 752, a resistor 754, a resistor 756, a resistor 758, an inductor 760, and a supply 768. Resistor 756 represents supply resistance $R_{SUPP}$, and resistor 758 represents load resistance ($R_L$). Resistor 754 represents the series resistance $R_c$, and capacitor 752 represents decoupling capacitance. Resistive impedance for model 750 is equal to $R_c//(R_{SUPP}+R_L)$. With reference to FIG. 9, a digital pre-distortion circuit 900 can be used as current signal distortion mitigation circuit 104 (FIG. 1) and is similar to circuit 600 (FIG. 6). In some embodiments, digital pre-distortion circuit 900 is coupled to input 101 (FIG. 1) which receives the digital input $d_a[n]$ and provides digital input $d_b[n]$ at output 107 for use by encoder 105 (FIG. 2). Digital pre-distortion circuit 900 includes multiplier 602 configured as a squaring circuit, adder 604 configured as a subtractor, filter 606 configured a digital pre-distortion filter, a multiplier 908, a multiplier 914, and an adder 616. Multiplier 908 receives the digital signal $d_{pdf}[n]$ from filter 606 and the signal $d_a[n]$ and combines the signals $d_{pdf}[n]$ and $d_a[n]$ for receipt by multiplier 914. Multiplier 914 combines the signal from multiplier 908 with the coefficient $d_2$ and provides the product to adder 616. In various examples, digital pre-distortion circuit 900 may be implemented in hardware, software, or a combination of hardware and software. In some examples, digital pre-distortion circuit 900 may be implemented, without limitation, as a circuit (including logical circuits), application specific integrated circuits (ASICs), custom integrated circuits (ICs), system on a chip (SoC), or field-programmable gate array (FPGA) implementations. In other examples, digital pre-distortion circuit 900 may be implemented as part of a DAC controller. For example, digital pre-distortion circuit 900 may be implemented as part of the firmware of a DAC controller.

Figure 10:
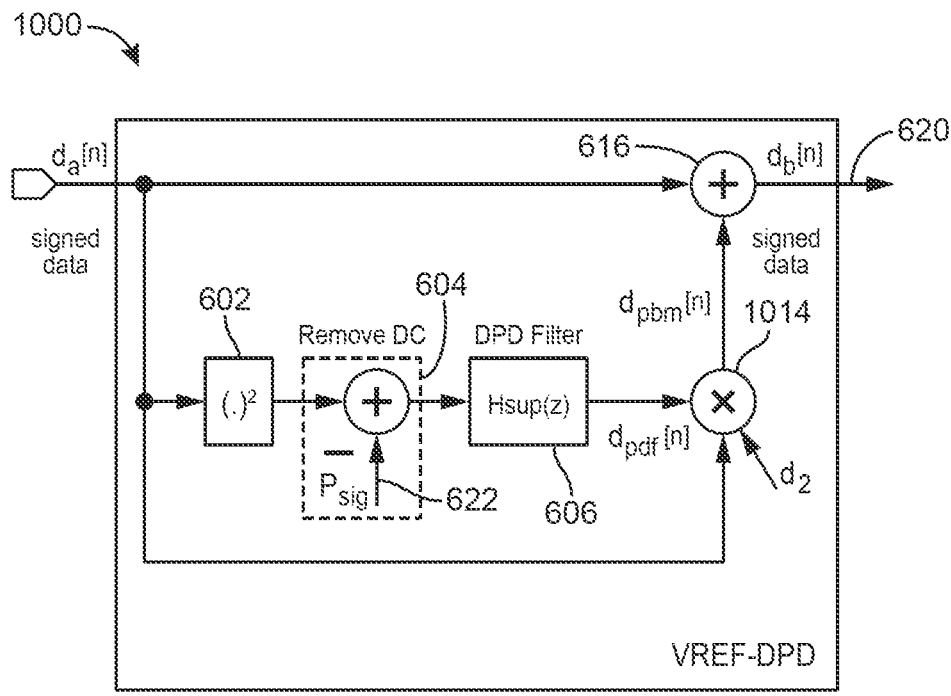
FIG. 10 is a schematic block diagram of a current signal distortion mitigation circuit for use in the digital-to-analog converter system illustrated in FIG. 1, in accordance with various embodiments.

With reference to FIG. 10, a digital pre-distortion circuit 1000 can be used as current signal distortion mitigation circuit 104 (FIG. 1) and is similar to circuit 600 (FIG. 6) and circuit 900 (FIG. 9). In some embodiments, digital pre-distortion circuit 900 is coupled to input 101 (FIG. 1) which receives the digital input $d_a[n]$ and provides digital input $d_b[n]$ at output 107 for use by encoder 105 (FIG. 2). Digital pre-distortion circuit 900 includes multiplier 602 configured as a squaring circuit, adder 604 configured as a subtractor, filter 606 configured a digital pre-distortion filter, a multiplier 1014, and an adder 616. Multiplier 1014 receives the digital signal $d_{pdf}[n]$ from filter 606, the signal $d_a[n]$ and the coefficient $d_2$ and combines them for receipt by adder 616. In various examples, digital pre-distortion circuit 1000 may be implemented in hardware, software, or a combination of hardware and software. In some examples, digital pre-distortion circuit 1000 may be implemented, without limitation, as a circuit (including logical circuits), application specific integrated circuits (ASICs), custom integrated circuits (ICs), system on a chip (SoC), or field-programmable gate array (FPGA) implementations. In other examples, digital pre-distortion circuit 1000 may be implemented as part of a DAC controller. For example, digital pre-distortion circuit 1000 may be implemented as part of the firmware of a DAC controller.

Figure 11:
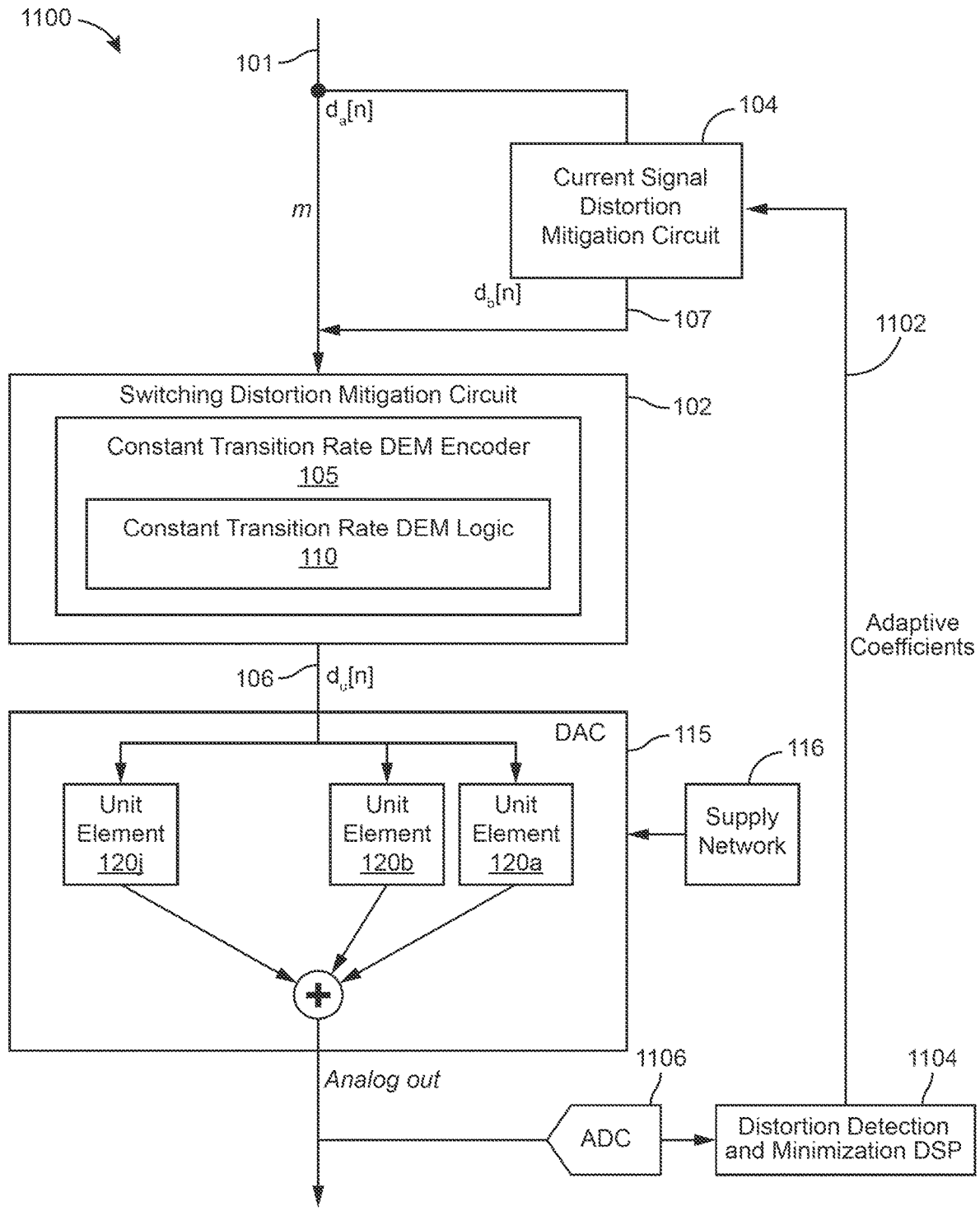
FIG. 11 is a schematic block diagram of a digital-to-analog converter system, in accordance with various embodiments.

With reference to FIG. 11, switching distortion mitigation circuit 1100 is similar to switching distortion mitigation circuit 100 (FIG. 1). Switching distortion mitigation circuit 1100 includes a feedback path including an ADC 1106 and a distortion detection and minimization digital signal processor 1104. ADC 1106 converts the analog output signal from DAC 115 and provides a digital representation of the analog output signal to distortion detection and minimization digital signal processor 1104. ADC 1106 can be any type of analog to digital converter suitable for high frequency (e.g., RF) signals. Distortion detection and minimization digital signal processor 1104 processes the digital signal from ADC 1106 and provides digital filter coefficients for filter 606 (FIGS. 6, 9, and 10) and the d2 coefficient for multipliers 608, 914, or 1014 (FIGS. 6, 9, and 10, respectively). Distortion detection and minimization digital signal processor 1104 is configured to detect distortion and select or calculate the digital filter coefficients and/or the d2 coefficient (e.g., adaptive coefficients 1102) to reduce detected distortion. In some embodiments, the detected distortion is compared to a threshold, and the digital filter coefficients and/or the d2 coefficient are iteratively adjusted to bring the distortion closer to the threshold. Distortion detection and minimization digital signal processor 1104 can utilize a least mean squared algorithm or other error minimization algorithm. According to various examples, distortion detection and minimization digital signal processor 1104 may be implemented in hardware, software, or a combination of hardware and software. In some examples, the distortion detection and minimization digital signal processor 1104 is a processor that may be implemented, without limitation, as a circuit (including logical circuits), custom integrated circuits (ICs), system on a chip (SoC), digital signal processor executing software, or field-programmable gate array (FPGA) implementations.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A method comprising:
receiving a first digital signal;
changing the first digital signal to provide a second digital signal, wherein the change of the first digital signal reduces distortion associated with a supply network providing a reference voltage;
providing a selection signal to a plurality of unit elements in response to the second digital signal, the unit elements receiving the reference voltage and providing voltage or current in response to the selection signal; and
providing an analog signal in response to the second digital signal.

2. The method of claim 1, further comprising:
determining a first number of the unit elements of a digital-to-analog converter to be turned on from an off state, based, at least in part, on a number of transitions $N_{trn}$;
determining a second number of the unit elements of the digital-to-analog converter to be turned off from an on state, based, at least in part, on the number of transitions $N_{trn}$;
selecting, using a constant transition rate dynamic element matching algorithm, the first number of the unit elements from the unit elements in the off state to be turned on; and
selecting, via the dynamic element matching algorithm, the second number of the unit elements from the unit elements in the on state to be turned off.

3. The method of claim 2, further comprising:
generating the selection signal as a unary code, wherein the unary code is configured to turn on the selected first number of the unit elements, and turn off the selected second number of the unit elements, wherein each respective bit position of the unary code controls a state of a respective unit element corresponding to the respective bit position; and
controlling the state of each of the unit elements based on the unary code.

4. The method of claim 3, wherein determining whether the number of transitions $N_{trn}$ can be performed further comprises:
determining whether a value of the second digital signal is less than ($N_{trn}/2$), and further that the total number of the unit elements minus the value of the second digital signal is greater than ($N_{trn}/2$).

5. The method of claim 3, further comprising:
adjusting the number of transitions $N_{trn}$ based on a determination that the number of transitions $N_{trn}$ cannot be performed, wherein adjusting the number of transitions $N_{trn}$ includes reducing the number of transitions $N_{trn}$.

6. The method of claim 1, wherein changing the first digital signal uses a digital filter having a response related to a response of the supply network.

7. The method of claim 1, wherein changing the first digital signal is a digital pre-distortion operation.

8. The method of claim 7, wherein the digital pre-distortion operation comprises an open loop approach using pre-defined digital filter coefficients and a d2 gain coefficient or comprises a closed loop approach using an analog-to-digital converter (ADC) to digitize the analog signal and a processor to provide the digital filter coefficients and the d2 gain coefficient.

9. A circuit comprising:
a plurality of unit elements;
a digital input configured to receive a first digital signal;
circuitry configured to adjust the first digital signal using a supply network response and provide a second digital signal; and
wherein the circuitry is configured to provide a code for turning the unit elements to an on state or an off state in accordance with the second digital signal, wherein the code is provided such that a variation of a number of the unit elements transitioning from the off state to the on state or from the on state to the off state is decreased.

10. The circuit of claim 9, whereby the circuitry reduces distortion due to switching current associated with the unit elements.

11. The circuit of claim 9, whereby the circuitry provides digital pre-distortion to reduce distortion due to current through a supply network.

12. The circuit of claim 9, whereby the circuitry reduces distortion due to switching current in the circuit.

13. The circuit of claim 9, wherein the circuitry comprises a digital filter having a frequency response corresponding to the supply network response.

14. The circuit of claim 9, wherein the second digital signal is defined by the following expression: $(x_a + d_2 x_a \times x_a^2 * h_{SUP}(nT))$ where $x_a$ is the first digital signal, $d_s$ is a coefficient, and $h_{SUP}(nT)$ is related to the supply network response.

15. The circuit of claim 9, wherein the circuitry comprises:
a first multiplier configured to receive the first digital signal;
a subtracter coupled to the first multiplier;
a filter coupled to the subtracter;
a second multiplier coupled to the filter; and an adder coupled to the first multiplier and the second multiplier configured to provide the second digital signal.

16. A system comprising:
a first circuit configured to provide a digitally pre-distorted input signal; and
a digital-to-analog converter comprising a plurality of unit elements, a digital input, and an analog output, each unit element configured to receive a reference voltage and is controlled by a control signal provided in response to the digitally pre-distorted input signal, wherein the digital-to-analog converter provides an analog signal at the analog output, wherein the first circuit is configured to reduce distortion due to digital signal dependent changes to the reference voltage.

17. The system of claim 16, wherein the digital signal dependent changes are due at least in part to current provided through a supply network that supplies the reference voltage.

18. The system of claim 16, wherein the first circuit comprises:
a first multiplier configured to receive an input signal;
a subtracter coupled to the first multiplier;
a filter coupled to the subtracter;
a second multiplier coupled to the filter;
an adder coupled to the first multiplier and the second multiplier; and
a third multiplier coupled between the first multiplier and the second multiplier.

19. The system of claim 16, wherein the first circuit comprises:
a first multiplier configured to receive an input signal;
a subtracter coupled to the first multiplier;
a filter coupled to the subtracter;
a second multiplier coupled to the filter; and
an adder coupled to the first multiplier and the second multiplier.

20. The system of claim 16, further comprising:
a second circuit configured to provide a code for turning the unit elements to an on state or an off state in response to the digitally pre-distorted input signal, wherein the code is provided using dynamic element matching logic.

21. An apparatus, comprising:
circuitry configure to change a first digital signal and provide a second digital signal, wherein the change of the first digital signal reduces distortion associated with a supply network providing a reference voltage, wherein the circuitry is configured to provide a selection signal to a plurality of unit elements in response to the second digital signal, the unit elements receiving the reference voltage and providing voltage or current in response to the selection signal, wherein the circuitry is configured to provide an analog signal in response to the second digital signal.

* * * * *